United States Patent
Bang et al.

(10) Patent No.: US 10,908,754 B2
(45) Date of Patent: Feb. 2, 2021

(54) TOUCH SENSING UNIT AND DISPLAY DEVICE INCLUDING THE SAME

(71) Applicant: SAMSUNG DISPLAY CO., LTD., Yongin-si (KR)

(72) Inventors: Gyeong Nam Bang, Seoul (KR); Chang Ho Lee, Busan (KR); Hye Yun Han, Hwaseong-si (KR); Young Bae Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/459,711

(22) Filed: Jul. 2, 2019

(65) Prior Publication Data

US 2020/0089369 A1 Mar. 19, 2020

(30) Foreign Application Priority Data

Sep. 19, 2018 (KR) .......................... 10-2018-0112025

(51) Int. Cl.
 *G06F 3/044* (2006.01)
 *G06F 3/041* (2006.01)
 *H01L 27/32* (2006.01)

(52) U.S. Cl.
 CPC .......... *G06F 3/0446* (2019.05); *G06F 3/0416* (2013.01); *G06F 3/0445* (2019.05); *G06F 3/0448* (2019.05); *H01L 27/323* (2013.01); *G06F 2203/04112* (2013.01)

(58) Field of Classification Search
 None
 See application file for complete search history.

(56) References Cited

U.S. PATENT DOCUMENTS

| | | | |
|---|---|---|---|
| 2011/0032209 A1* | 2/2011 | Kim ........................ | G06F 3/044 345/174 |
| 2014/0098057 A1* | 4/2014 | Lee ......................... | G06F 3/044 345/174 |
| 2016/0216806 A1* | 7/2016 | Nakamura .............. | B32B 15/02 |
| 2016/0299610 A1* | 10/2016 | Yoon ................... | H01L 51/5281 |
| 2019/0064960 A1 | 2/2019 | Na et al. | |

FOREIGN PATENT DOCUMENTS

| | | |
|---|---|---|
| KR | 20160077961 | 7/2016 |
| KR | 20170029016 | 3/2017 |

* cited by examiner

*Primary Examiner* — Aneeta Yodichkas
(74) *Attorney, Agent, or Firm* — F. Chau & Associates, LLC

(57) ABSTRACT

A touch sensing unit, includes a plurality of first sensing electrodes and a plurality of second sensing electrodes intersecting with and insulated from the plurality of first sensing electrodes. The plurality of first sensing electrodes includes a plurality of first sensor portions and a plurality of first connection portions connecting each of the plurality of first sensor portions with one another. The plurality of second sensing electrodes includes a plurality of second sensor portions, a plurality of stem sensors extended from the plurality of second sensor portions, and a plurality of second connection portions connecting each of the plurality of sensor portions with one another. Each of the plurality of first sensor portions includes a plurality of depressions indented inwardly. Each of the plurality of stem sensors is disposed such that it is at least partially surrounded by a respective depression of the plurality of depressions.

25 Claims, 33 Drawing Sheets ically, to a touch sensing unit and a display
TOUCH SENSING UNIT AND DISPLAY DEVICE INCLUDING THE SAME This application claims priority to Korean Patent Application No. 10-2018-0112025 filed on Sep. 19, 2018 in the Korean Intellectual Property Office, the disclosure of which is herein incorporated by reference in its entirety.

TECHNICAL FIELD

The present disclosure relates to a display device and, more specifically, to a touch sensing unit and a display device including the same.

DISCUSSION OF THE RELATED ART

Display devices are an important component of various products, as they may be used in displaying multimedia. There are many different types of display devices available today. Examples of commonly used display devices include organic light-emitting display (OLED) devices and liquid-crystal display (LCD) devices.

Modern user interfaces, such as those used in smartphones and tablet computers, commonly utilize touch as a primary means of input. To sense the touch of a user, a touch sensing unit may be used. Touch sensing units may be incorporated into a display device so that a single surface may be used for displaying multimedia and sensing touch input. For example, a touch sensor may be attached to one surface of a display panel or may be fabricated integrally with a display panel. A user can input information by pressing or touching the touch sensing unit while viewing images displayed on the screen of the display device.

SUMMARY

A touch sensing unit, includes a plurality of first sensing electrodes and a plurality of second sensing electrodes intersecting with and insulated from the plurality of first sensing electrodes. The plurality of first sensing electrodes includes a plurality of first sensor portions and a plurality of first connection portions connecting each of the plurality of first sensor portions with one another. The plurality of second sensing electrodes includes a plurality of second sensor portions, a plurality of stem sensors extended from the plurality of second sensor portions, and a plurality of second connection portions connecting each of the plurality of sensor portions with one another. Each of the plurality of first sensor portions includes a plurality of depressions indented inwardly. Each of the plurality of stem sensors is disposed such that it is at least partially surrounded by a respective depression of the plurality of depressions.

A display device includes a base layer having a display area and a non-display area at least partially surrounding the display. A plurality of first signal lines is disposed on a first side border of the non-display area. A plurality of second signal lines is disposed on a second side border of the non-display area. A ground line is disposed on a third border of the non-display area. A plurality of first sensing electrodes is disposed in the display area and is connected to the plurality of first signal lines. A plurality of second sensing electrodes is disposed in the display area, is connected to the plurality of second signal lines, and intersects with and is insulated from the plurality of first sensing electrodes. A plurality of ground electrodes disposed in the display area, connected to the ground line, and disposed between the plurality of first sensing electrodes and the plurality of second sensing electrodes. Each of the ground electrodes of the plurality of ground electrodes are insulated from the plurality of first sensing electrodes and the plurality of second sensing electrodes.

BRIEF DESCRIPTION OF THE DRAWINGS

A more complete appreciation of the present disclosure and many of the attendant aspects thereof will become more apparent by describing in detail exemplary embodiments thereof with reference to the attached drawings, in which.

DETAILED DESCRIPTION OF THE DRAWINGS

Figure 1:
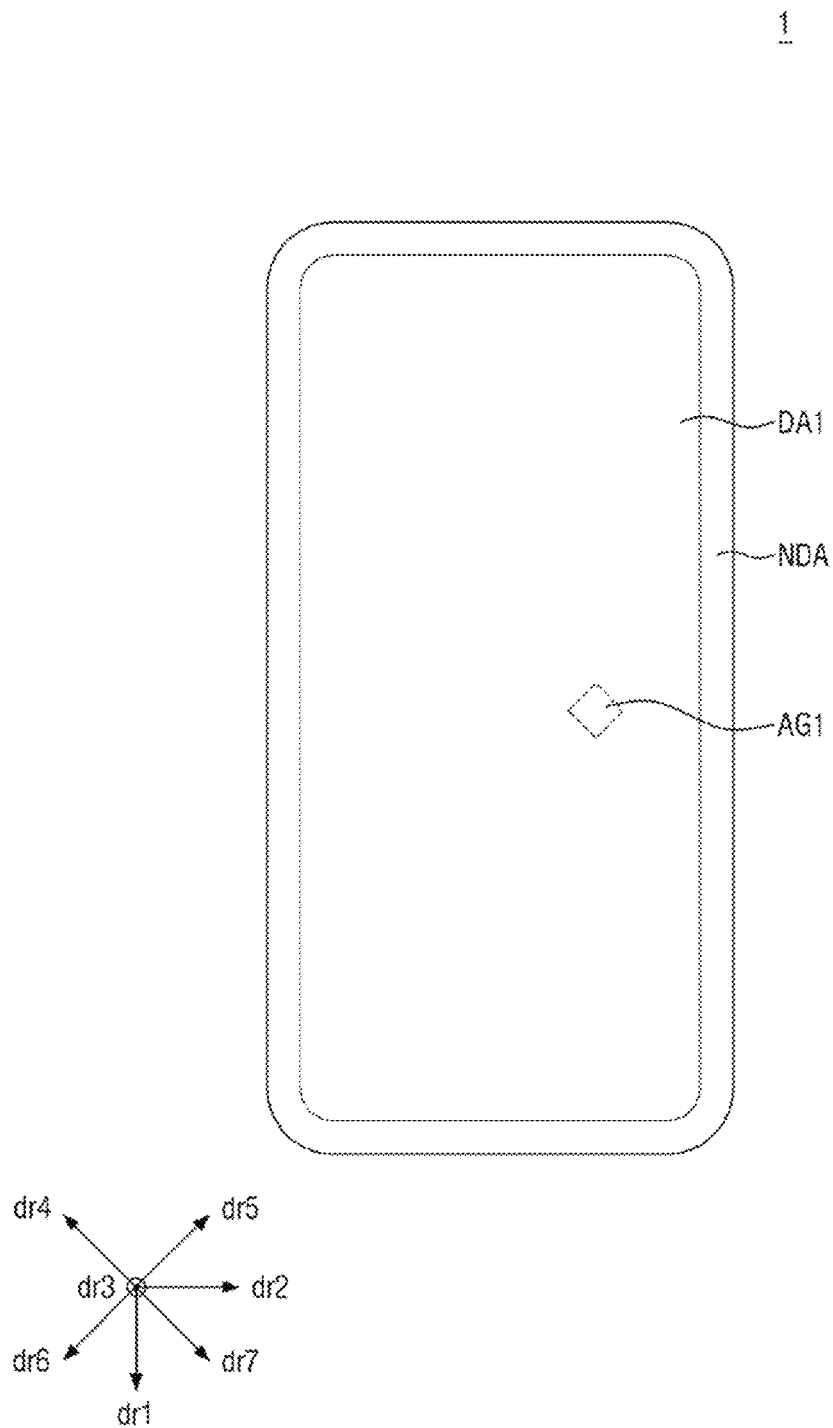
FIG. 1 is a plan view illustrating an organic light-emitting display device according to an exemplary embodiment of the present disclosure.

A more complete appreciation of the present disclosure and many of the attendant aspects thereof may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art.

It will be understood that when an element or layer is referred to as being "on", "connected to" or "coupled to" another element or layer, it can be directly on, connected or coupled to the other element or layer or intervening elements or layers may be present.

Display devices, according to a variety of exemplary embodiments of the present disclosure, may be used as a display screen of a variety of devices that display video or still image. The various display devices may be configured to display video or still images either monoscopically or stereoscopically. These display devices may be incorporated into portable electronic devices such as a mobile communications terminal, a smart phone, a tablet PC, a laptop computer, a smart watch, and a navigation device, as well as stationary electronic devices, such as a television, a monitor, an electronic billboard, and a smart household device, such as an Internet of Things device.

Hereinafter, exemplary embodiments of the present invention will be described in detail with reference to the accompanying drawings. In the following description, an organic light-emitting display device will be described as an example of a display device. It is, however, to be understood that the present disclosure is not limited thereto. The display device, according to exemplary embodiments of the present disclosure, can also be applied to other display devices such as a liquid-crystal display device, a field emission display device, an electrophoretic device, a quantum-dot display device, or a micro LED display device, without departing from the scope of the present disclosure. Like reference numerals may denote like elements throughout the specification and the drawings.

Figure 2:
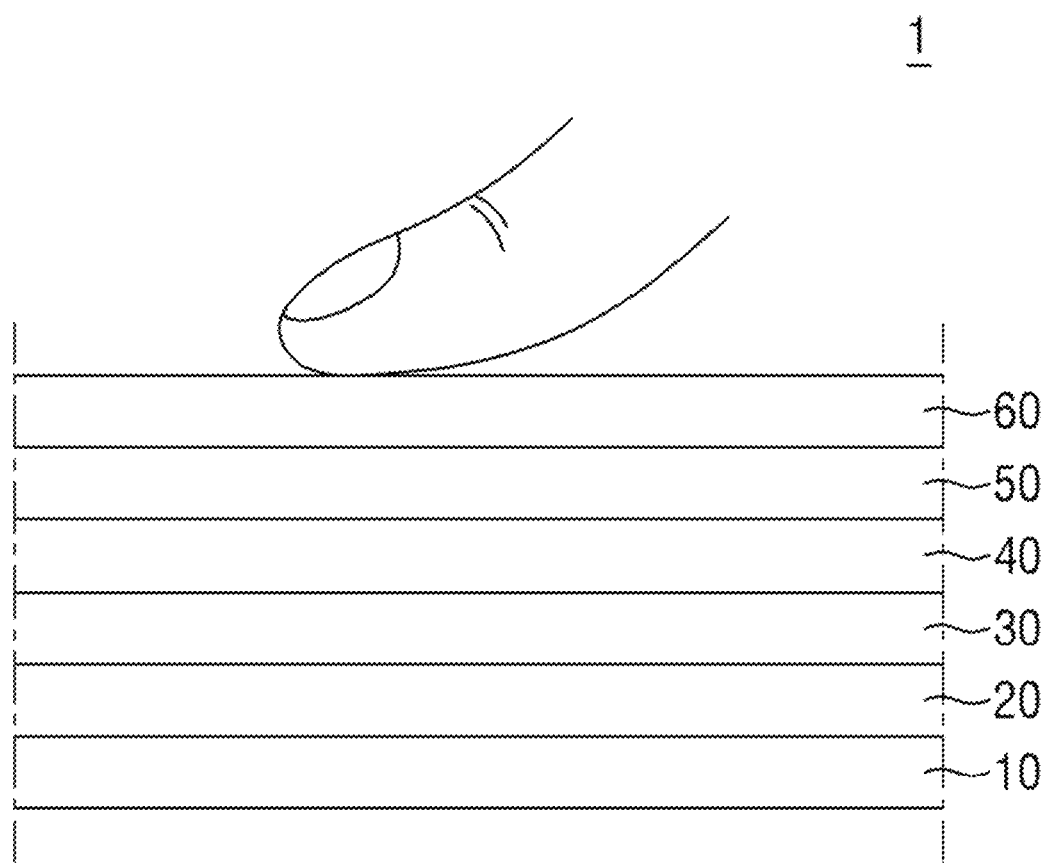
FIG. 2 is a cross-sectional view of an organic light-emitting display device according to an exemplary embodiment of the present disclosure.

FIG. 1 is a plan view of an organic light-emitting display device according to an exemplary embodiment of the present disclosure. FIG. 2 is a cross-sectional view of the organic light-emitting display device according to an exemplary embodiment of the present disclosure.

Referring to FIG. 1, the organic light-emitting display device 1 may have a substantially rectangular shape that is longer in a first direction dr1 than in a second direction dr2, according to an exemplary embodiment of the present disclosure. For example, the border of the organic light-emitting display device 1 may include longer sides extended in the first direction dr1 and shorter sides extended in the second direction dr2.

As used herein, for convenience of illustration, the vertical direction in the drawings is defined as a first direction dr1, and the horizontal direction is defined as a second direction dr2. In addition, a direction orthogonal to the first direction dr1 and to the second direction dr2 is defined as a third direction dr3 and may extend in the direction out from the page. In addition, as inclined directions different from the first direction dr1 and the second direction dr2 on the plane, a direction extended in the upper left direction with respect to the imaginary reference point is defined as a fourth direction dr4, a direction extended in the upper right direction with respect to the imaginary reference point is defined as a fifth direction dr5, a direction extended in the lower left direction with respect to the imaginary reference point is defined as a sixth direction dr6, and a direction extended in the lower right direction with respect to the imaginary reference point is defined as a seventh direction dr7. It is to be noted that the exemplary embodiments of the present disclosure are not limited by the directions defined above and the first to seventh directions dr1 to dr7 are relative directions provided for illustrative purposes.

The organic light-emitting display device 1 may include a display area DA1 and a non-display area NDA.

The display area DA1 is defined as an area for displaying images. The organic light-emitting display device 1 may include a plurality of pixels that are entirely disposed within the display area DA1. The display area DA1 may also be used as an area for recognizing a user's touch input as well as the area for displaying images.

The non-display area NDA is defined as an area where no image is displayed. For example, none of the pixels are disposed within the non-display area NDA. The non-display area NDA may be disposed on the outer side of the display area DA1 and may at least partially surround the display area DA1.

A speaker module, a camera module, a sensor module, etc. may be disposed in a certain part of the non-display area NDA. In an exemplary embodiment of the present disclosure, the sensor module may include a luminance sensor, a proximity sensor, an infrared sensor, and/or an ultrasonic sensor.

Referring to FIG. 2, in an exemplary embodiment of the present disclosure, the organic light-emitting display device 1 may include a first substrate 10, a circuit layer 20 disposed on the first substrate 10, a light-emitting element layer 30 disposed on the circuit layer 20, an encapsulation layer 40 disposed on the light-emitting element layer 30, a touch layer 50 disposed on the encapsulation layer 40, and a second substrate 60 disposed on the touch layer 50. It is, however, to be understood that the present disclosure is not limited thereto. Each of the layers may be made up of either a signal layer or multiple layers. Another layer may be added or some of the layers described herein may be omitted, as desired. The stacked structure of the organic light-emitting display device 1 will be described later with reference to FIG. 35.

Figure 35:
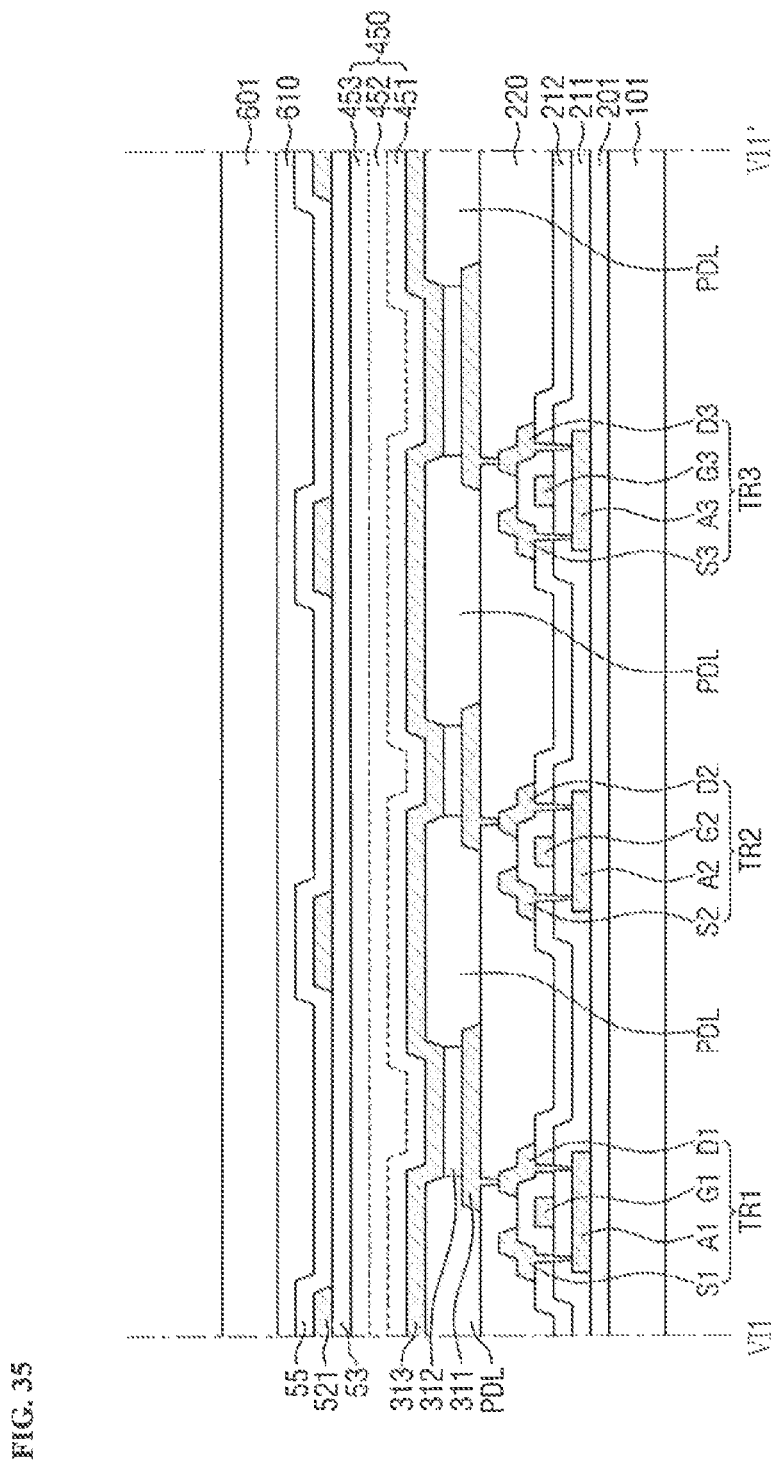
FIG. 35 is a cross-sectional view taken along line VI1-VI1' of FIG. 34.

As shown in FIG. 35, the second substrate 60 includes a cover window 601. The upper surface of the cover window 601 may be the surface on which a user's input means (e.g. a finger or stylus) touches.

Figure 3:
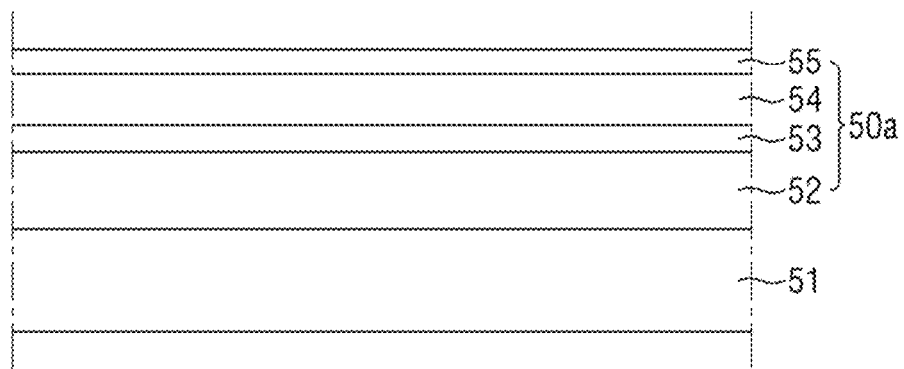
FIG. 3 is a cross-sectional view schematically illustrating a structure of a touch sensing unit according to an exemplary embodiment of the present disclosure.

As shown in FIG. 3, the organic light-emitting display device 1 may include a touch sensing unit 50a. In an exemplary embodiment of the present disclosure, the touch sensing unit 50a may be disposed in the touch layer 50. The arrangement of constituent elements of the touch sensing unit 50a will be described with reference to FIGS. 3 and 4.

Figure 4:
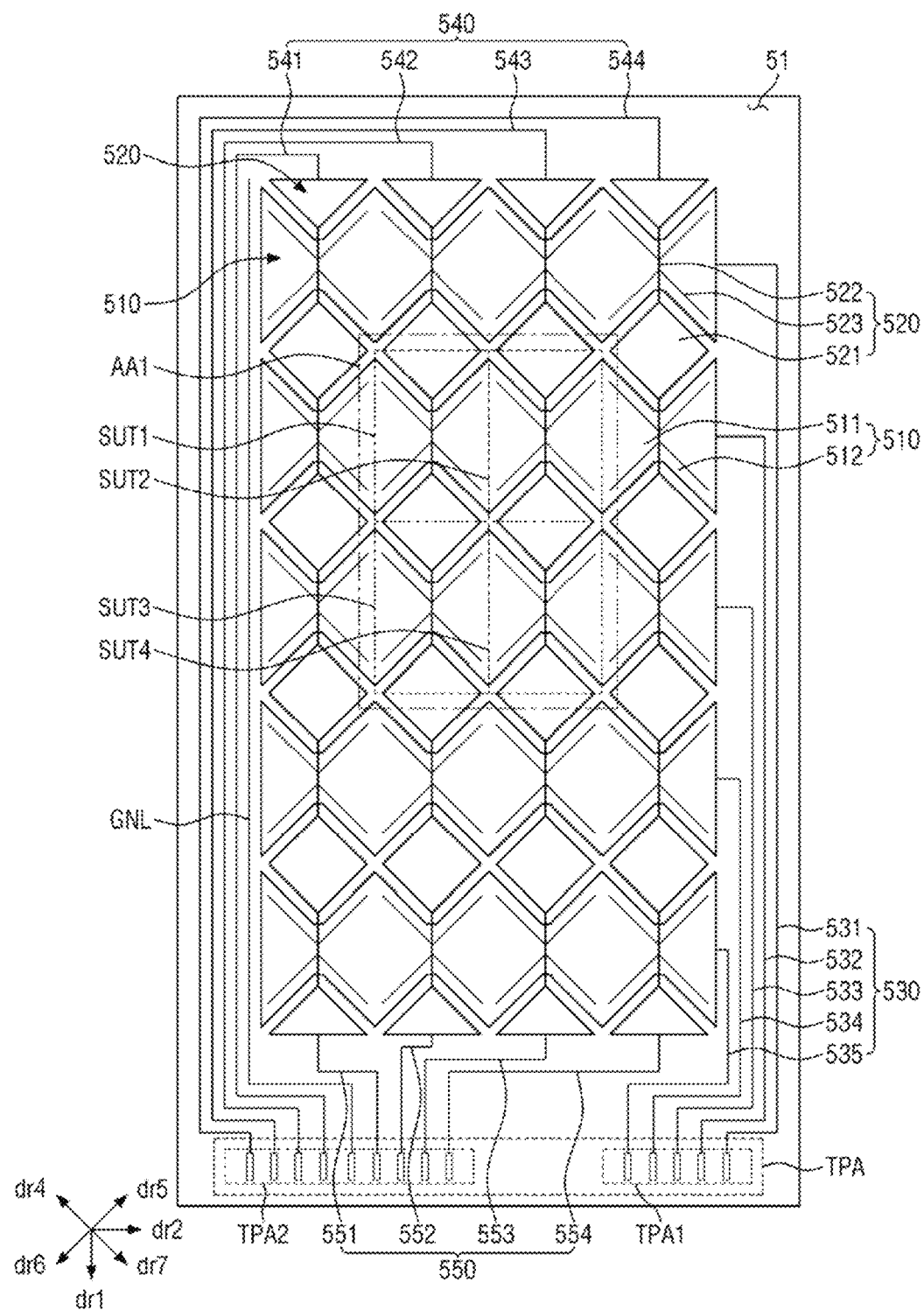
FIG. 4 is a plan view schematically illustrating an arrangement of a touch sensing unit according to an exemplary embodiment of the present disclosure.

FIG. 3 is a cross-sectional view schematically illustrating the structure of the touch sensing unit, according to an exemplary embodiment of the present disclosure. FIG. 4 is a plan view schematically showing the arrangement of the touch sensing unit according to the above exemplary embodiment.

Referring to FIGS. 3 and 4, the touch sensing unit 50a may have a multi-layer structure and may be disposed on a base layer 51. The touch sensing unit 50a includes pluralities of sensing electrodes 510 and 520, a plurality of signal lines 530, 540 and 550 connected to the plurality of sensing electrodes 510 and 520, and at least one insulating layer (e.g., a first touch insulating layer 53). The touch sensing unit 50a may be configured to sense an input from an external source by, for example, capacitive sensing. In general, the pluralities of sensing electrodes 510 and 520 are arranged in the area failing within the display area DA1 described above, and the plurality of signal lines 530, 540 and 550 are arranged in the area falling within the non-display area NDA, and the at least one insulating layer 53 may be disposed over the entire surface of the display area DA1 and the non-display area NDA. It is, however, to be understood that the present disclosure is not limited thereto.

As shown in FIG. 3, the touch sensing unit 50a may include, in an exemplary embodiment of the present disclosure, a first touch conductive layer 52, a first touch insulating layer 53, a second touch conductive layer 54 and a second touch insulating layer 55 stacked on one another in the third direction dr3. According to an exemplary embodiment of the present disclosure, the second touch insulating layer 55 may be omitted.

The touch sensing unit 50a may be disposed on the base layer 51. The base layer 51 may correspond to the above-described encapsulation layer 40. In an exemplary embodiment of the present disclosure, the base layer 51 may correspond to a second inorganic layer 451 (see FIG. 35) of an encapsulation layer 450 (see FIG. 35). For example, the first touch conductive layer 52 may be disposed directly on the second inorganic layer 451 of the encapsulation layer 450. It is, however, to be understood that the present disclosure is not limited thereto. The organic light-emitting display device 1 may further include a touch buffer layer, which may work as the base layer 51. The touch buffer layer nay be disposed on the second inorganic layer of the encapsulation layer. The first touch conductive layer 52 may be disposed on the touch buffer layer. The touch buffer layer may be configured to smoothen the surface of the encapsulation layer 450 and to prevent permeation of moisture or air. The touch buffer layer may be an inorganic layer containing silicon nitride (SiNx).

Each of the first touch conductive layer 52 and the second touch conductive layer 54 may be made up of a single-layer or a stack of multiple layers stacked in the third direction dr3, when the touch conductive layer is made of a single layer, it may include a metal layer or a transparent conductive layer. The metal layer may, for example, include molybdenum, silver, titanium, copper, aluminum, and/or alloys thereof. The transparent conductive layer may include a transparent conductive oxide such as indium tin oxide (ITO), indium zinc oxide (IZO), zinc oxide (ZnO), and/or indium tin zinc oxide (ITZO). In addition, the transparent conductive layer may include a conductive polymer such as PEDOT, metal nanowire, graphene, etc.

When the touch conductive layer is made of multiple layers, it may include multiple metal layers. The multiple metal layers may have a three-layer structure of, for example, titanium (Ti)/aluminum (Al)/titanium (Ti). The touch conductive layer may include at least one metal layer and at least one transparent conductive layer.

Each of the first touch conductive layer 52 and the second touch conductive layer 54 includes a plurality of patterns. In the following description, it is assumed that the first touch conductive layer 52 includes first conductive patterns, and the second touch conductive layer 54 includes second conductive patterns. Each of the first conductive patterns and the second conductive patterns may include signal lines 530, 540 and 550 and sensing electrodes 510 and 520.

The stacked structure and material of the sensing electrodes 510 and 520 may be determined based on the desired sensitivity. The RC delay may affect the sensitivity. Since the resistance of the sensing electrodes 510 and 520 including the metal layer is smaller than that of the transparent conductive layer, the RC value is decreased. Therefore, the charging time of the capacitors defined between the sensing electrodes 510 and 520 is reduced. The sensing electrodes including the transparent conductive layer are less visible by a user as compared to the metal layer, and the input area is increased so as to increase the capacitance of the capacitors.

In an exemplary embodiment of the present disclosure, the sensing electrodes, including the metal layer, may have a mesh shape to prevent them from being seen by a user, it is, however, to be understood that the present disclosure is not limited thereto. The thickness of the encapsulation layer 450 may be adjusted so that the noise generated by the constituent elements of the light-emitting element layer 30 does not affect the touch sensing unit 50a. Each of the first touch insulating layer 53 and the second touch insulating layer 55 may be made up of a single layer or multiple layers. Each of the first touch insulating layer 53 and the second touch insulating layer 55 may include an inorganic material, an organic material, and/or an organic-inorganic composite material. The inorganic material may include aluminum oxide, titanium oxide, silicon oxide, silicon oxynitride, zirconium oxide, and/or hafnium oxide. The organic material may include an acrylic resin, a methacrylic resin, a polyisoprene, a vinyl resin, an epoxy resin, a urethane resin, a cellulose resin, a siloxane resin, a polyimide resin, a polyamide resin, and/or a perylene resin.

As shown in FIG. 4, the sensing electrodes 510 and 520 may be disposed in the area falling within the display area DA1 of the organic light-emitting display device, and the signal lines 530, 540 and 550 may be disposed in the area falling within the non-display area NDA. Therefore, the areas corresponding to the display area DA1 and the non-display area NDA, respectively, may be defined in the base layer 51.

The sensing electrodes 510 and 520 include a plurality of first sensing electrodes 510 and a plurality of second sensing electrodes 520. In the exemplary embodiment, it is assumed that the first sensing electrodes 510 are sensing electrodes, while the second sensing electrodes 520 are driving electrode. Alternatively, the first sensing electrodes 510 may be driving electrodes while the second sensing electrodes 520 may be sensing electrodes.

The first sensing electrodes 510 intersect with the second sensing electrodes 520. The first sensing electrodes 510 are extended in the second direction dr2 and are arranged in parallel to each other. The second sensing electrodes 520 are extended in the first direction dr1 and are arranged in parallel to each other. The first sensing electrodes 510 and the second sensing electrodes 520 may be insulated from one another and, for example, may be spaced apart from each other.

The first sensing electrodes 510 and the second sensing electrodes 520 may sense an external input by mutual-capacitance sensing. Also, the coordinates of an external input may be obtained by mutual-capacitance sensing during a first period of time and then the coordinates of the external input may be re-obtained by self-capacitance sensing during a second period of time.

Each of the first sensing electrodes 510 includes first sensor portions 511 and first connection portions 512. The first sensor portions 511 are arranged in the second direction dr2. Each of the first connection portions 512 connects two adjacent ones of the first sensor portions 511. The first sensor portions 511 and the first connection portions 512 may be disposed on the same layer. The two adjacent ones of the first sensor portions 511 may be substantially physically connected with each other through the first connection portions 512.

Each of the second sensing electrodes 520 includes second sensor portions 521 and second connection portions 522. The second sensor portions 521 are arranged in the first direction dr1. Each of the second connection portions 522 connects two adjacent ones of the second sensor portions 521. The second sensor portions 521 may be disposed on a layer different from the second connection portions 522. The second connection portions 522 may be disposed on a layer different from the first connection portions 512 and may traverse the first connection portions 512 such that they are insulated from each other.

The second sensing electrodes 520 may further include stem sensors 523 labeled 523a to 523d. The stem sensors may extend from the second sensor portions 521. Each of the stem sensors 523a to 523d may have a shape that penetrates into the first sensor portions 511. This will be described in detail later with reference to FIG. 5.

The first signal lines 530 are connected to first ends of the first sensing electrodes 510. According to an exemplary embodiment of the present disclosure, the first signal lines 530 may be connected to the right ends of the first sensing electrodes 510 and may be extended generally in the first direction dr1 along the right border of the area falling within the non-display area NDA.

The second signal lines 540 are connected to first ends of the second sensing electrodes 520. According to an exemplary embodiment of the present disclosure, the second signal lines 540 may be connected to the upper ends of the second sensing electrodes 520 and may be bent so as to be extended generally along the left border.

The third signal lines 550 are connected to opposed ends of the second sensing electrodes 520. According to an exemplary embodiment of the present disclosure, the third signal lines 550 may be connected to the lower ends of the second sensing electrodes 520 and may be disposed generally near the lower border.

As shown in the drawings, each of the second sensing electrodes 520 may be double-routed, whereas each of the first sensing electrodes 510 may be single-routed. The first sensing electrodes 510 may be applied with a first reference voltage signal, while the second sensing electrodes 520 may be applied with a second reference voltage signal. The first reference voltage signal applied to each of the first sensing electrodes 510 may have a voltage level that is lower than the voltage level of the second reference voltage signal applied to each of the second sensing electrodes 520.

Since the second sensing electrodes 520 are applied with the signal having a higher voltage level, the voltage level in the touch sensing electrode may be greatly changed depending on the distance to the signal lines connected thereto. For example, if one signal line is connected to only one end of each of the second sensing electrodes 520, the voltage level of the second sensor portions 521 adjacent to the end may be different from the voltage level of the second sensor portions 521 adjacent to the opposed end. In view of the above, the second signal lines 540 and the third signal lines 550 are connected to first ends and the opposed ends of the second sensing electrodes 520, respectively, so that the difference in the voltage levels of the second sensor portions 521 between the two ends of the driving electrodes can be reduced. It is to be noted that the number of signal lines connected to the second sensing electrodes 520 and the arrangement of the signal lines are not limited to those shown in the drawings.

The touch sensing unit 50a may further include a ground line GNL. The ground line GNL may be disposed between the third signal lines 550 and the plurality of sensing electrodes. The ground line GNL may be applied with a third reference voltage signal (e.g., a voltage signal having the same level as the voltage signal applied to the common electrode). The third reference voltage signal may be, but is not limited to being, a voltage signal having a voltage level that is lower than that of the first and second reference voltage signals. The ground line GNL may prevent coupling between the third signal lines 550 and the plurality of sensing electrodes 510 and 520.

The ground line GNL may be further disposed between the first signal lines 530 and the second signal lines 540 and between the second signal lines 540 and the third signal lines 550.

In an exemplary embodiment of the present disclosure, a pad terminal area TPA may be formed on one side of the non-display area NDA of the organic light-emitting display device 1. The pad terminal area TPA includes a plurality of pad terminals connected to the signal lines. The pad terminal area TPA may include a first pad terminal area TPA1 connected to the first signal lines 530, and a second pad terminal area TPA2 connected to the second signal lines 540 and the third signal lines 550. The second pad terminal area TPA2 may include, but is not limited to including, a pad terminal connected to the ground line GNL.

In an exemplary embodiment of the present disclosure, the first pad terminal area TPA1 may be disposed in a lower right area of the non-display area NDA, and the second pad terminal area TPA2 may be disposed in a lower left area of the non-display area NDA. It is to be noted that the position of the pad terminal area TPA is not limited thereto. The position of the pad terminal area TPA may vary depending on the arrangement needed to establish electrical connections with other elements that may be connected to the touch member.

The first sensor portions 511 of the first sensing electrodes 510 and the second sensor portions 521 of the second sensing electrodes 520, adjacent to each other, may form a plurality of unit sensing areas (for example, SUT1 to SUT4). For example, halves of the two first sensor portions 511 adjacent to each other in the second direction dr2 and halves of the two second sensor portions 521 adjacent to each other in the first direction dr1 may form a square or a rectangle shape, with the intersections between the first sensing electrodes 510 and the second sensing electrodes 520 in the center. The area defined by the half regions of the adjacent first sensor portions 511 and the second sensor portions 521 may be single unit sensing areas SUT1 to SUT4. The plurality of unit sensing areas SUT1 to SUT4 may be arranged in row and column directions. The column direction may correspond to the first direction dr1, and the row direction may correspond to the second direction dr2.

In each of the unit sensing areas SUT1 to SUT4, the capacitance value between the adjacent driving electrodes and the sensing electrodes is measured to determine whether or not a touch input is made, and if so, the position of the touch input may be obtained as touch input coordinates.

Each of the unit sensing areas SUT1 to SUT4 may be larger than the emission region of one pixel, which will be described later. For example, each of the unit sensing areas SUT1 to SUT4 may cover a plurality of emission regions. The length of one side of each of the unit sensing areas SUT1 to SUT4 may be for example, in the range of 3.5 mm to 4.5 mm, but these regions are not limited to being within this range.

Next, the arrangement of the sensing electrodes will be described with reference to FIGS. 5 to 8.

Figure 5:
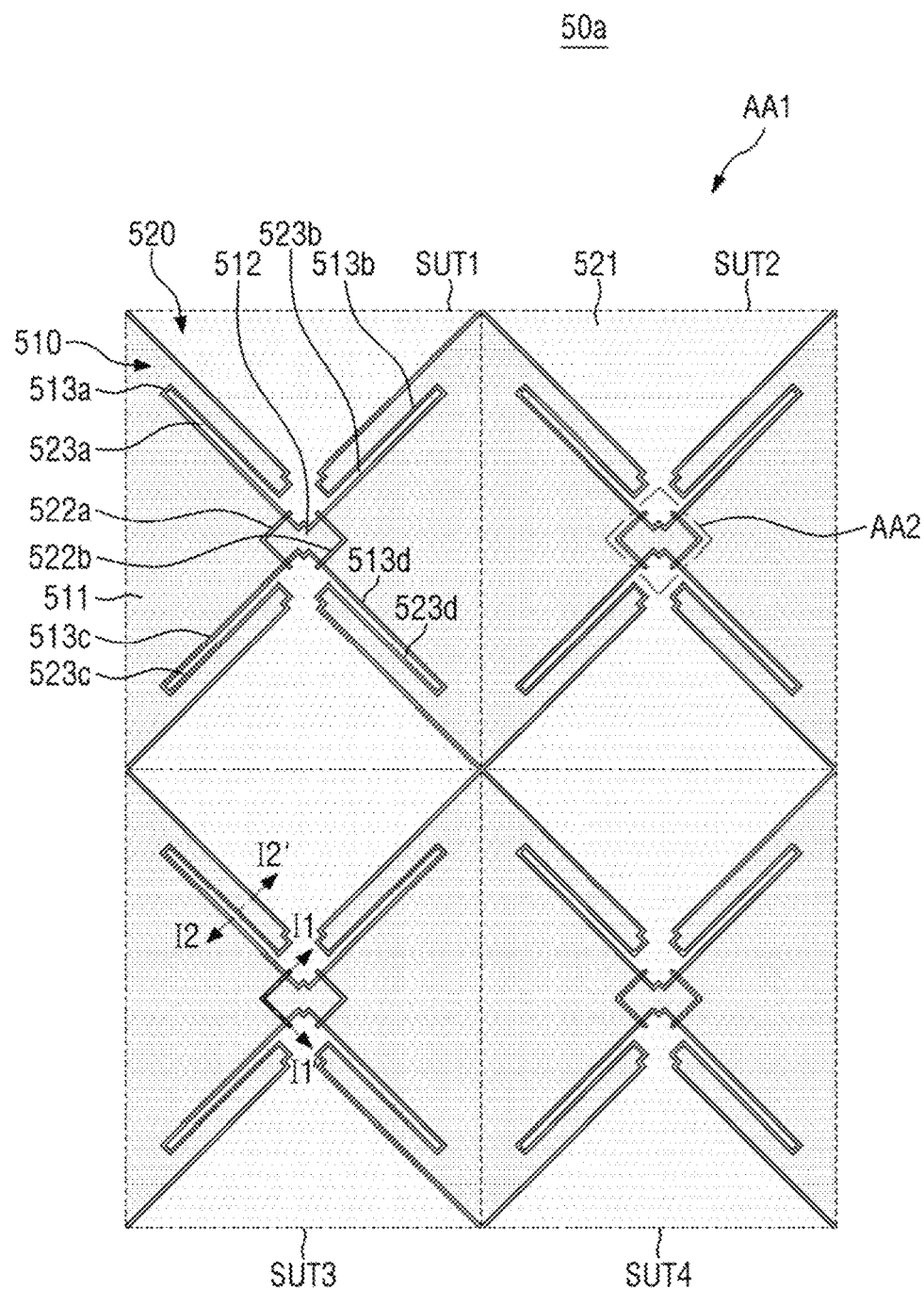
FIG. 5 is a layout view illustrating an area AA1 of the touch sensing unit shown in FIG. 4, according to an exemplary embodiment of the present disclosure.
Figure 6:
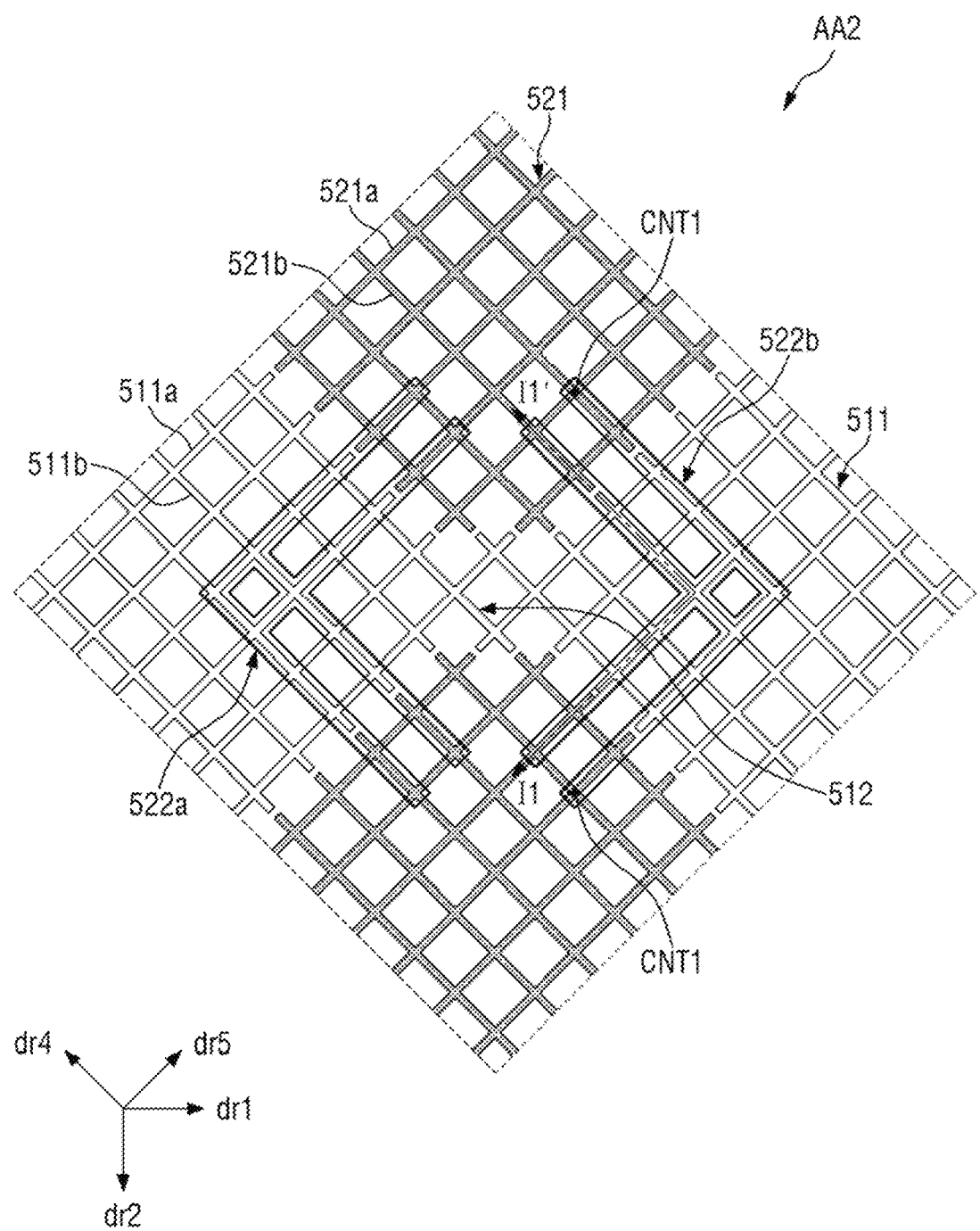
FIG. 6 is an enlarged view of area AA2 of FIG. 5.
Figure 7:
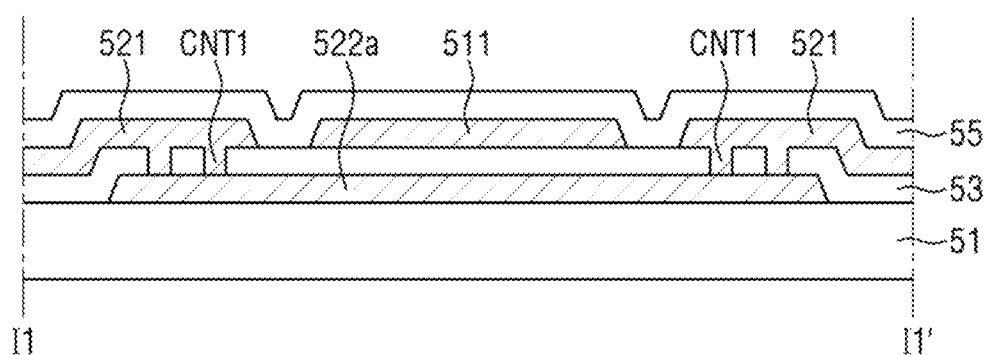
FIG. 7 is a cross-sectional view taken along line I1-I1' of FIG. 6 in the touch sensing unit according to an exemplary embodiment of the present disclosure.
Figure 8:
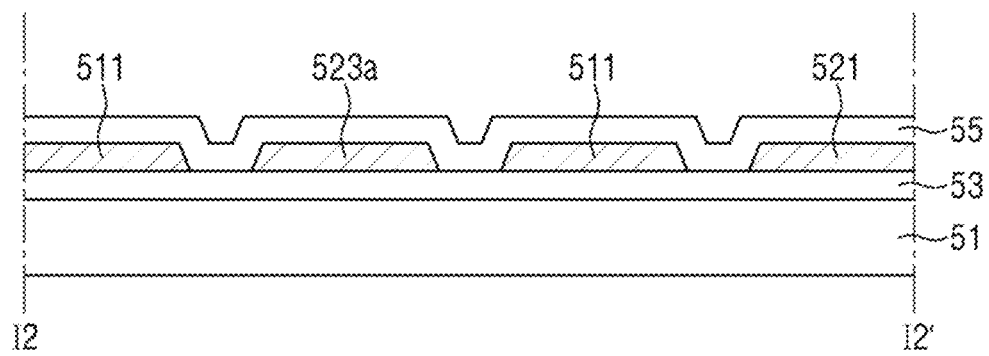
FIG. 8 is a cross-sectional view taken along line I2-I2' of FIG. 5 in the touch sensing unit according to an exemplary embodiment of the present disclosure.

FIG. 5 is a layout view illustrating area AA1 in FIG. 4 in the touch sensing unit 50a, according to an exemplary embodiment of the present disclosure. FIG. 6 is an enlarged view of area AA2 in FIG. 5. FIG. 7 is a cross-sectional view taken along line I1-I1' in FIG. 6 in the touch sensing unit 50a, according to an exemplary embodiment of the present disclosure. FIG. 8 is a cross-sectional view taken along line I2-I2' in FIG. 5 in the touch sensing unit 50a according to an exemplary embodiment of the present disclosure.

It is to be noted that area AA1 in FIG. 4 is shown to include four unit sensing areas, e.g., the first to fourth unit sensing areas SUT1 to SUT4 arranged adjacent to one another in a matrix. For convenience of illustration, the sensing electrodes 510 and 520 disposed in the first unit sensing area SUT1 will be described. It is to be understood that the description of the sensing electrodes disposed in the first unit sensing area SUT1 can be equally applied to the sensing electrodes 510 and 520 disposed in the other unit sensing areas (for example, SUT2 to SUT4).

Referring to FIGS. 5 to 8, a plurality of first sensing electrodes 510 and a plurality of second sensing electrodes 520 are spaced apart from each other. The first sensing electrodes 510 may include a plurality of depressions 513a to 513d. The second sensing electrodes 520 may include a plurality of stem sensors 523a to 523d that are at least partially surrounded by the depressions 513a to 513d of the first sensing electrodes 510, respectively.

The plurality of depressions 513a to 513d refer to the portions of the first sensor portions 511 indented inwardly. The stem sensors 523a to 523d refer to the protrusions that are extended from the second sensor portions 521 and at least partially surrounded by the depressions 513a to 513d, respectively. For example, the stem sensors 523a to 523d may have a shape that penetrates into the depressions 513a to 513d of the first sensor portions 511, respectively.

The depressions 513a to 513d of the first sensing electrodes 510 and the respective stem sensors 523a to 523d of the second sensing electrodes 520 may be spaced apart from each other.

According to an exemplary embodiment of the present disclosure, with respect to the center of the first unit sensing area SUT1 (the center of the first connection portion 512 in the drawings), the first sensing electrode 510 may include four depressions 513a to 513d and the second sensing electrode 520 may include four stem sensors 523a to 523d.

The first sensing electrode 510 may include a first depression 513a that is indented in the fourth direction dr4, a second depression 513b that is indented in the fifth direction dr5, a third depression 513c that is indented in the sixth direction dr6, and a fourth depression 513d that is indented in the seventh direction dr7. The first and third depressions 513a and 513c may be formed in the same first sensor portion 511 as each other, and the second and the fourth depressions 513b and 513d may be formed in the same first sensor portion 511 as each other.

The second sensing electrode 520 may include a first stem sensor 523a extended in the fourth direction dr4 from the second sensor portion 521, a second stem sensor 523b extended in the fifth direction dr5 from the second sensor portion 521, a third stem sensor 523c extended in the sixth direction dr6 from the second sensor portion 521, and a fourth stem sensor 523d extended in the seventh direction dr7 from the second sensor portion 521. The first stem sensor 523a and the second stem sensor 523b may be formed in the same single second sensor portion 521, and the third stem sensor 523c and the fourth stem sensor 523d may be formed in the same single second sensor portion 521.

The first stem sensor 523a may be at least partially surrounded by the first depression 513a, the second stem sensor 523b may be at least partially surrounded by the second depression 513b, the third stem sensor 523c may be at least partially surrounded by the third depression 513c, and the fourth stem sensor 523d may be at least partially surrounded by the fourth depression 513d. The stem sensors 523a to 523d may be extended substantially parallel to the boundary lines between the second sensor portions 521 from which the stem sensors 523a to 523d are extended and the first sensor portions 511 disposed therebetween.

Since the second sensing electrodes 520 include the stem sensors 523a to 523d, the total length of the boundary lines between the first sensing electrodes 510 and the second sensing electrodes 520 may be increased, compared to when there is no stem sensors. Accordingly, the area where the capacitance can be generated between the first sensing electrodes 510 and the second sensing electrodes 520 is widened, so that the mutual capacitance $C_m$ between first sensing electrodes 510 and the second sensing electrodes 520 can be increased.

According to an exemplary embodiment of the present disclosure, the first sensing electrodes 510 and the second sensing electrodes 520 may include electrodes in the form of a mesh. The first sensing electrodes 510 may include a plurality of first electrode lines 511a extended in the fourth direction dr4, and a plurality of second electrode lines 511b extended in the fifth direction dr5 intersecting the fourth direction dr4, for example, at a right angle. The second sensing electrodes 520 may include a plurality of third electrode lines 521a extended in the fourth direction dr4, and a plurality of fourth electrode lines 521b extended in the fifth direction dr5. The emission regions PXA_R, PXA_G and PXA_B (see FIG. 34) of a pixel may be formed in mesh holes formed by the first electrode lines 511a and the second electrode lines 511b intersecting each other and the third electrode lines 521a and the fourth electrode lines 521b intersecting each other, which will be described later with reference to FIG. 34.

The first electrode lines 511a and the second electrode lines 511b, which belong to one first sensing electrode 510, may be physically connected to one another. On the other hand, the third electrode lines 521a and the fourth electrode lines 521b, which belong to one second sensing electrode 520, might not be physically connected to one another. The third electrode lines 521a and the fourth electrode lines 521b, which belong to one second sensor portion 521, may be physically connected to one another. It is to be noted that the third electrode lines 521a and the fourth electrode lines 521b included in one of the second sensor portions 521 may be spaced apart from the third electrode lines and the fourth electrode lines included in another one of the second sensor portions.

Adjacent second sensor portions 521 may be electrically connected to one another by the second connection portions 522 disposed on a layer different from the second sensor portions 521. For example, adjacent second sensor portions 521 may be electrically connected by two second connection portions 522a and 522b. Even if one of the second connection portions 522a and 522b is disconnected, the adjacent second sensor portions 521 can be electrically connected with each other by the other of the second connection portions 522a and 522b.

The first connection portions 512 may be disposed not only between the adjacent first sensor portions 511 but also between the adjacent second sensor portions 521 and between the two second connection portions 522a and 522b adjacent to each other when viewed from the top.

Next, the stacked relationship between the first sensing electrodes 510 and the second sensing electrodes 520 will be described.

First, the second connection portions 522 may be disposed on the base layer 51. The second connection portions 522 may correspond to the first touch conductive layer 52 described above. The first touch insulation layer 53 including the first contact holes CNT1 may be disposed on the second connection portions 522, and a part of the second connection portions 522 may be left exposed thereby.

The first sensor portions 511, the first connection portions 512 and the second sensor portions 521 may be disposed on the first touch insulation layer 53. The first sensor portions 511, the first connection portions 512 and the second sensor portions 521 may correspond to the second touch conductive layer 54 described above. The second sensor portions 521 may be in contact with the second connection portions 522 exposed by the first contact holes CNT1.

The stem sensors 523a to 523d may be disposed in the same layer as the first sensor portions 511 including the depressions 513a to 513d. For example, the stem sensors 523a to 523d may correspond to the second touch conductive layer 54.

Although the sensing electrodes include mesh-like electrode lines in the drawings, this is merely illustrative. In other implementations, the sensing electrodes may be implemented as common electrode patterns. Each of the common electrode patterns may overlap a plurality of emission regions (for example, PXA_R, PXA_G and PXA_B in FIG. 34) in the third direction dr3.

Next, a touch event occurring in the unit sensing areas SUT1 to SUT4 will be described.

Figure 9:
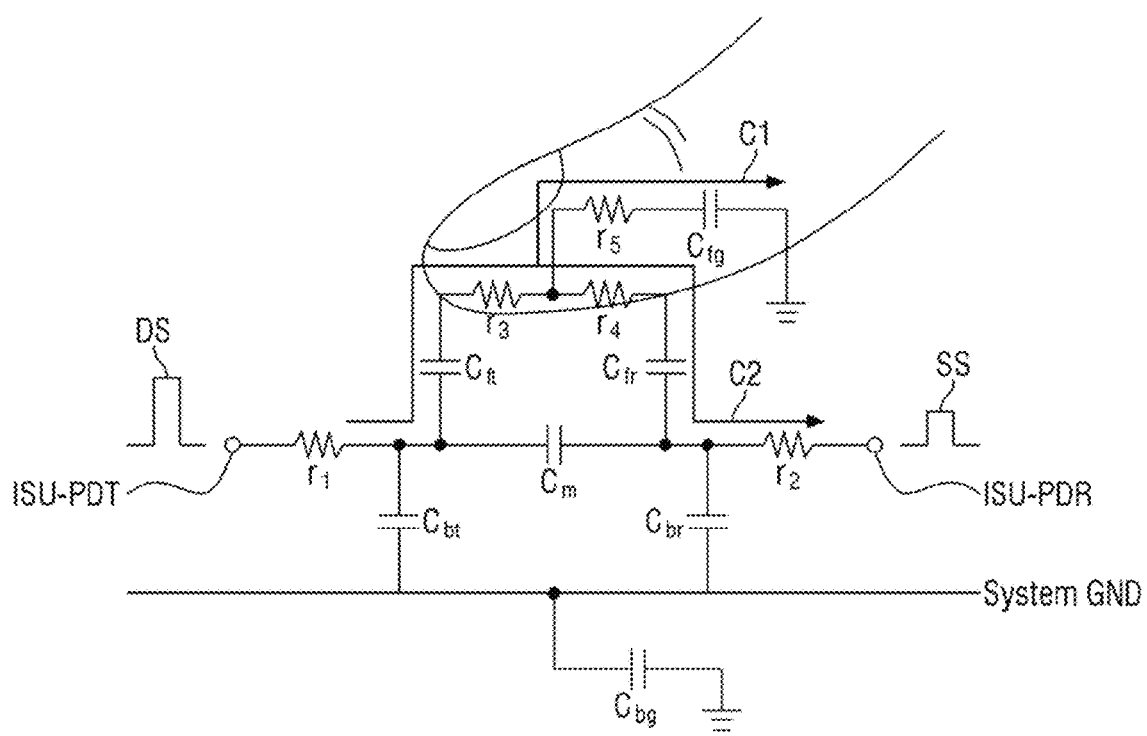
FIG. 9 is an equivalent circuit diagram illustrating a touch sensing unit when a touch event has occurred according to an exemplary embodiment of the present disclosure.

FIG. 9 is an equivalent circuit diagram illustrating the touch sensing unit 50a when a touch event has occurred, in accordance with an exemplary embodiment of the present disclosure.

When a touch event occurs, there is a change in the mutual capacitance $C_m$ defined between the first sensing electrode 510 and the second sensing electrode 520 at the point of the touch event. Referring to FIG. 9, when a touch event occurs, a capacitance (hereinafter referred to as a touch capacitance) is formed between the two terminals of mutual capacitance $C_m$. The touch capacitance may include two capacitances $C_{ft}$ and $C_{fr}$ connected in series.

The touch capacitance $C_{ft}$ is formed between input means (e.g., a finger or stylus) and one of the first sensing electrode 510 and the second sensing electrode 520 that is applied with a detection signal DS. The touch capacitance $C_{fr}$ is formed between input means and the other of the first sensing electrode 510 and the second sensing electrode 520. A microprocessor may read out a sensing signal SS from the other sensing electrode and measure, from the sensing signal SS, a change in the capacitance $\Delta C_m$ occurring before and after the input from the input means. The change in the capacitance $\Delta C_m$ can be measured by sensing the current change of the sensing signal SS.

FIG. 9 further shows capacitances $C_{bt}$ and $C_{br}$ between the system ground (System GND) and the first sensing electrode and between the system ground (System GND) and the second sensing electrode, respectively, the capacitance $C_{bg}$ between the system ground (System GND) and the ground, and the capacitance $C_{fg}$ between the input means and the ground. The system ground (System GND) may refer to a voltage level applied to the second pixel electrode CE shown in FIG. 35 or a comparable voltage level. In addition, FIG. 9 shows an equivalent resistance r1 between an input pad ISU-PDT and the sensing electrode to which the detection signal DS is applied, an equivalent resistance r2 between an output pad ISU-PDR and the other sensing electrode, and equivalent resistances r3, r4 and r5 formed by the input means.

As the distance between the upper surface of the touch sensing unit 50a and the upper surface of the cover window 601 decreases, the touch capacitances $C_{ft}$ and $C_{fr}$ increase. For example, for a foldable organic light-emitting emitting display device, the distance between the upper surface of the touch sensing unit 50a and the upper surface of the cover window 601 may be less than 0.5 mm in order to provide effective folding characteristics.

As the distance between the upper surface of the touch sensing unit 50a and the upper surface of the cover window 601 decreases, the amount of the signal moving along a first path C1 of FIG. 9 is decreased and the amount of the signal moving along a second path C2 of FIG. 9 is increased.

In the touch sensing unit 50a, according to an exemplary embodiment of the present disclosure, the stem sensors 523a to 523d of the second sensing electrodes 520 are disposed in the depressions 513a to 513d of the first sensing electrodes 510, respectively, such that the area between the sensing electrodes 510 and the second sensing electrodes 520 is increased, and accordingly the mutual capacitance $C_m$ can be increased.

Hereinafter, a touch sensing unit, according to an exemplary embodiment of the present disclosure, will be described. In the following description, elements that are not described in detail may be assumed to be at least similar to corresponding elements that have already been described with respect to FIGS. 1 to 9.

Figure 10:
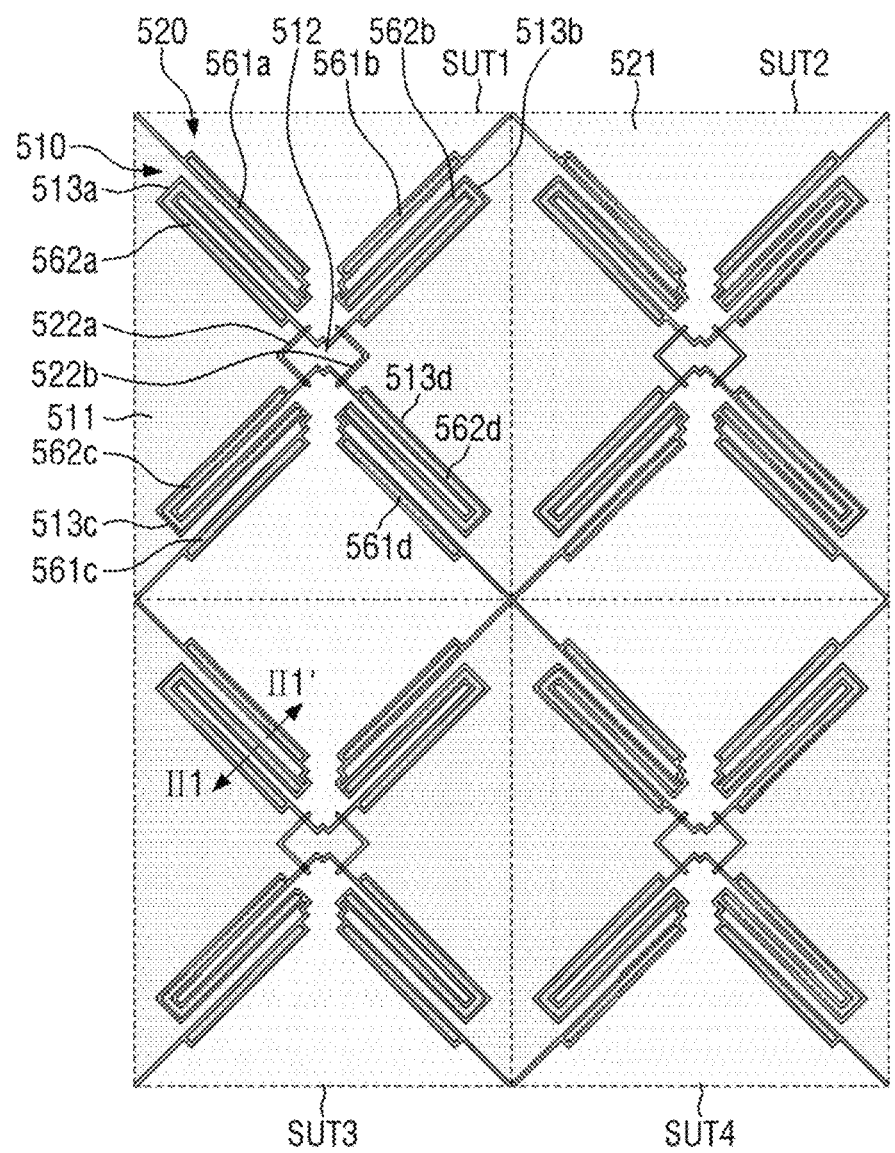
FIG. 10 is a layout view illustrating a pan of a touch sensing unit according to an exemplary embodiment of the present disclosure.
Figure 11:
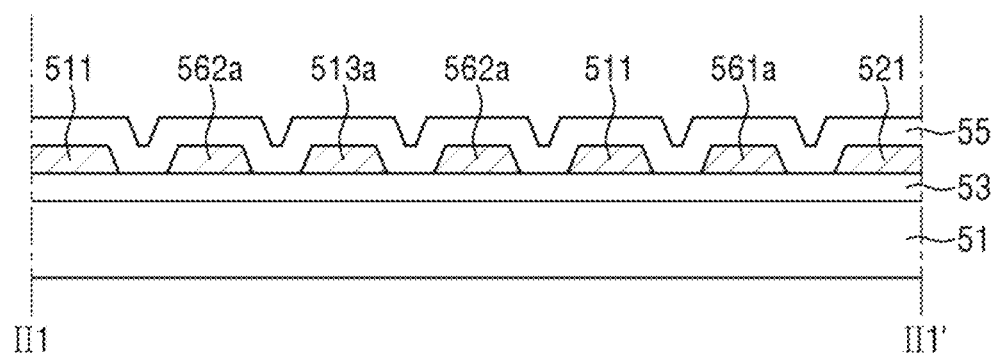
FIG. 11 is a cross-sectional view taken along line II1-II1' of FIG. 10 in a touch sensing unit according to an exemplary embodiment of the present disclosure.

FIG. 10 is a layout view illustrating a part of a touch sensing unit according to an exemplary embodiment of the present disclosure. FIG. 11 is a cross-sectional view illustrating a touch sensing unit according to an exemplary embodiment of the present disclosure, taken along line III-III' of FIG. 10. The examples shown in FIGS. 10 and 11 are modifications of the examples shown in FIGS. 5 and 8, respectively.

A touch sensing unit 50a_1, according to an exemplary embodiment of the present disclosure, shown in FIGS. 10 and 11 is substantially identical to the touch sensing unit 50a shown in FIGS. 5 and 8 except that the former further includes a plurality of dummy electrodes 561a to 561d and 562a to 562d.

The touch sensing unit 50a_1 may further include a plurality of dummy electrodes 561a to 561d and 562a to 562d. The dummy electrodes may be formed via the same process as the first sensing electrodes 510 and the second sensing electrodes 520, so that they may include the same material and may have the same stacked structure.

The dummy electrodes 561a to 561d and 562a to 562d are floating electrodes and are not electrically connected to the first sensing electrodes 510 or the second sensing electrodes 520. By disposing the dummy electrodes 561a to 561d and 562a to 562d in this manner, it is possible to make the boundary lines between the first sensor portions 511 and the second sensor portions 521 less noticeable.

When the first sensing electrodes 510 and the second sensing electrodes 520 have a mesh shape, the dummy electrodes 561a to 561d and 562a and 562d may also have a mesh shape and may be spaced apart front the respective sensor portions by several mm. It is, however, to be understood that the present disclosure is not limited thereto.

The touch sensing unit 50a_1 may include a plurality of first dummy electrodes 561a to 561d disposed between the first sensor portions 511 and the second sensor portions 521, respectively, and a plurality of second dummy electrodes 562a to 562d disposed between the depressions 513a to 513d and the stem sensors 523a to 523d, respectively. In a single unit sensing region, the touch sensing unit 50a_1 may include four first dummy electrodes 561a to 561d and four second dummy electrodes 562a to 562d.

The first dummy electrodes 561a to 561d may be disposed between the first sensor portions 511 and the second sensor portions 521 to adjust the spacing therebetween. The boundary lines between the first sensor portions 511 and the second sensor portions 521 may be extended generally in the fourth to seventh directions dr4 to dr7, respectively, with respect to the imaginary center point of the first unit sensing area SUT1. The four first sensor portions 511 may be disposed in a shape generally parallel to the directions of the boundary lines between the first sensor portions 511 and the second sensor portions 521.

In an exemplary embodiment of the present disclosure, in the first unit sensing area SUT1, the first dummy electrodes 561a to 551d may include a first dummy pattern 561a extended generally in the fourth direction dr4 between the first sensor portion 511 and the second sensor portion 521, a second dummy pattern 561b extended generally in the fifth direction dr5 between the first sensor portion 511 and the second sensor portion 521, a third dummy pattern 561c extended generally in the sixth direction dr6 between the first sensor portion 511 and the second sensor portion 521, and an eighth dummy pattern 561d extended generally in the seventh direction dr7 between the first sensor portion 511 and the second sensor portion 521. Although the first to fourth dummy patterns 561a to 561d are shown as having a rectangular shape in the drawings, this is merely illustrative and they may have various different shapes.

The second dummy electrodes 562a to 562d may be disposed between the depressions 513a to 513d of the first sensing electrodes 510 and the stem sensors 523a to 523d so as to adjust the spacing therebetween. For example, in the first unit sensing area SUT1, the second dummy electrodes 562a to 562d may include a fifth dummy pattern 562a disposed between the first depression 513a and the first stem sensor 523a, a sixth dummy pattern 562b disposed between the second depression 513b and the second stem sensor 523b, a seventh dummy pattern 562c disposed between the third depression 513c and the third stem sensor 523c, and an eighth dummy pattern 562d disposed between the fourth depression 513d and the fourth stem sensor 523d.

The second dummy electrodes 562a to 562d may have a substantially U-shape and may be disposed to at least partially surround the stem sensors 523a to 523d, respectively. It is, however, to be understood that the present disclosure is not limited thereto and other configurations may be used.

The dummy electrodes 561a to 561d and 562a to 562d may be configured to adjust the distance between the first sensing electrodes 510 and the second sensing electrodes 520. Accordingly, a change in the capacitance $\Delta C_m$ of the touch sensing unit 50a_1 may be adjusted to meet the specifications required in the organic light-emitting display device.

Although the first unit sensing area SUT1 includes the four first dummy electrodes 561a to 561d and the four second dummy electrodes 562a to 562d in FIG. 10, the numbers and locations thereof are not limited to those shown in FIG. 10. A single dummy electrode may be disposed such that it is divided into several pieces. Dummy electrodes may be disposed inside the sensing electrodes 510 and 520 to adjust the area of the sensing electrodes 510 and 520 (see FIGS. 32 and 33). In such case, the dummy electrodes may be disposed inside the sensing electrodes 510 and 520 to adjust the area, so that the capacitance $C_m$ of the sensing electrodes 510 and 520 can be adjusted.

By disposing the dummy electrodes 561a to 561d and 562a to 562d between the first sensor portions 511 and the second sensor portions 521, the area where the first sensor portions 511 overlaps with the second sensor portions 521 is reduced. Accordingly, the touch capacitances $C_{fi}$ and $C_{fr}$ can be reduced. As a result, it is possible to increase a change in the capacitance $\Delta C_m$ before and after an input from the input means.

Since the area occupied by the first sensor portions 511 and the second sensor portions 521 becomes relatively small by the dummy electrodes 561a to 561d and 562a to 562d, the overlapping area with the system ground (System GND) is reduced. As a result, it is possible to reduce the influence by the fluctuation of the system ground (System GND).

Figure 12:
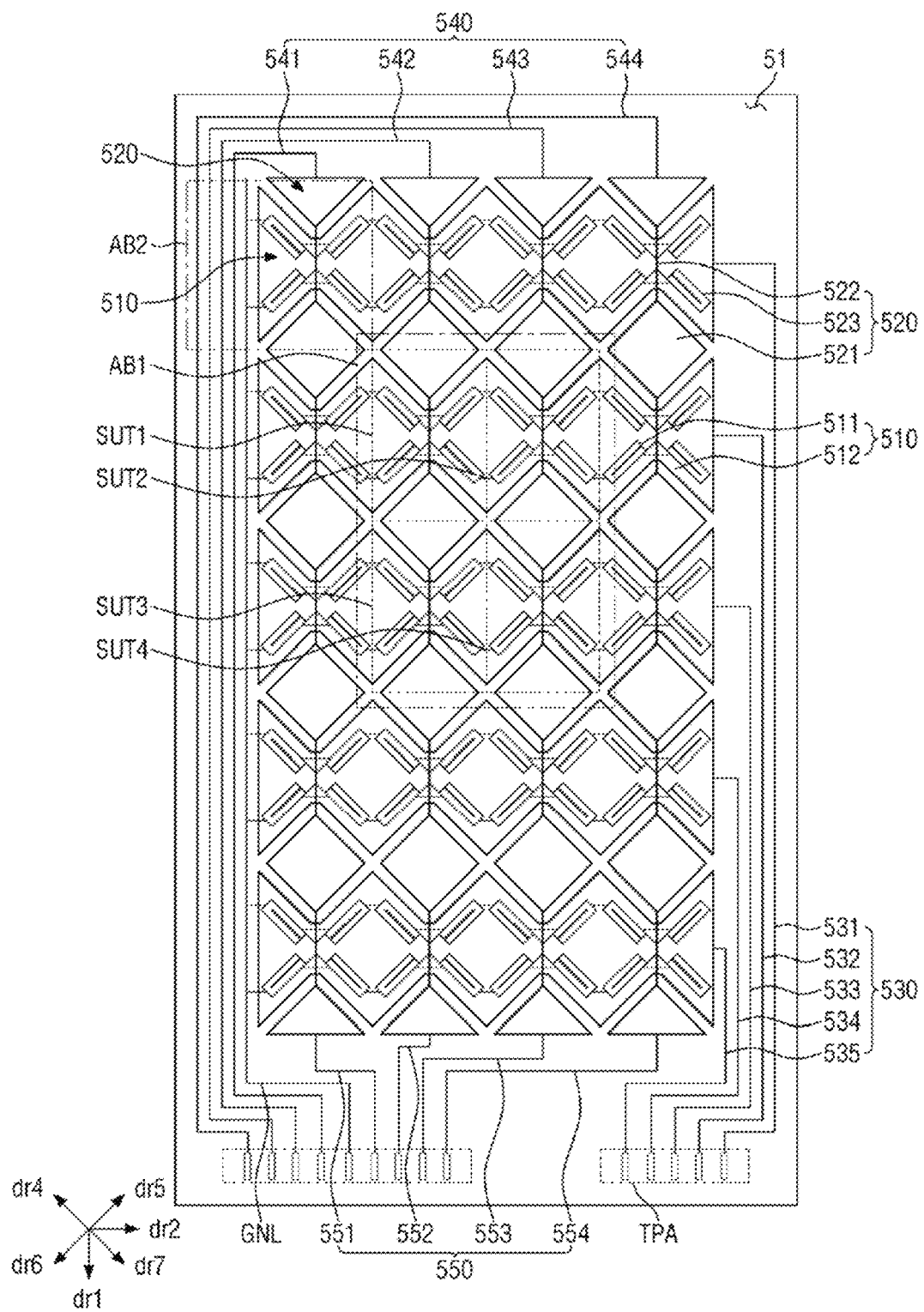
FIG. 12 is a plan view schematically illustrating an arrangement of a touch sensing unit according to an exemplary embodiment of the present disclosure.
Figure 13:
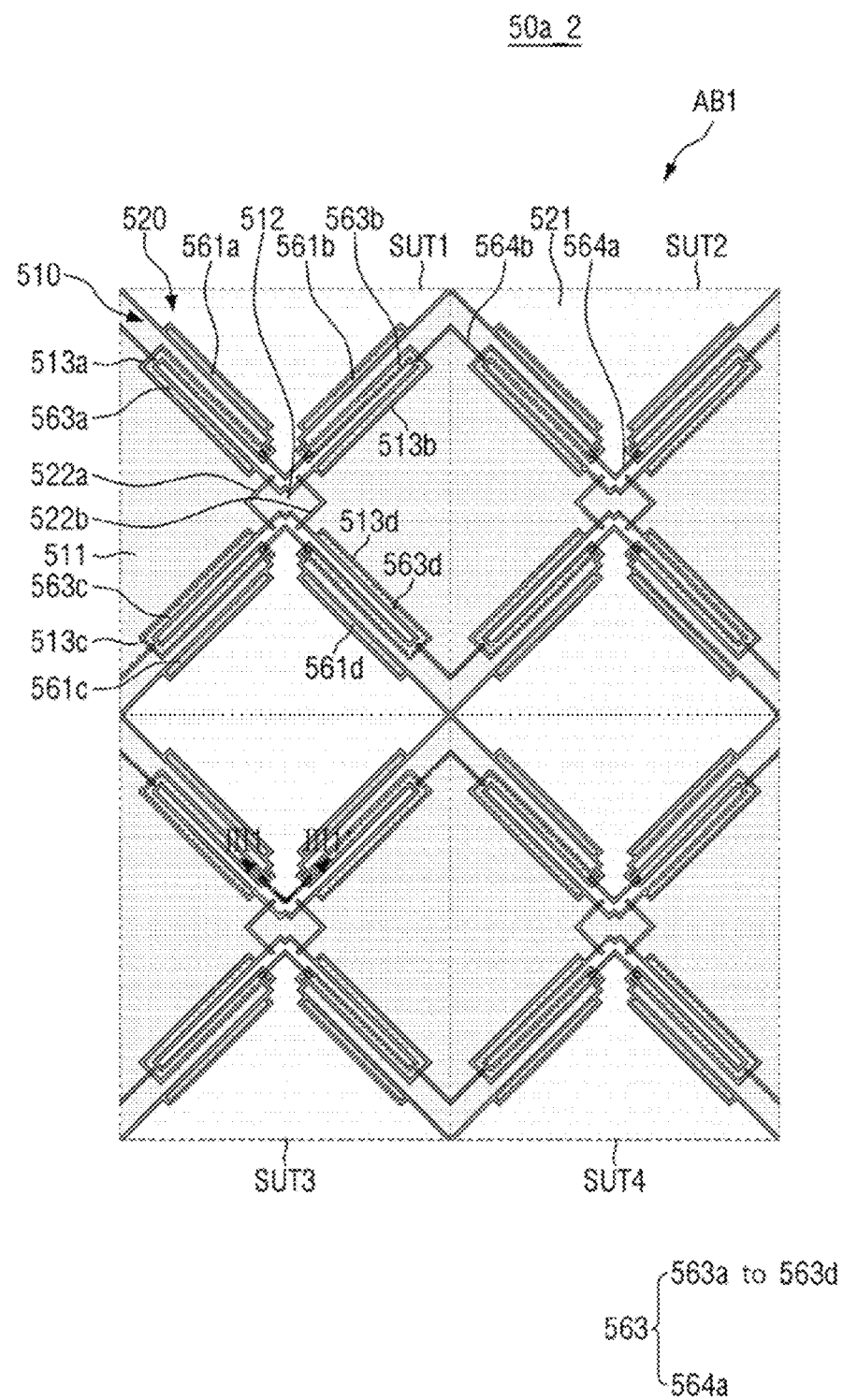
FIG. 13 is a layout view illustrating a portion corresponding to area AB1 in the touch sensing unit of FIG. 12.
Figure 14:
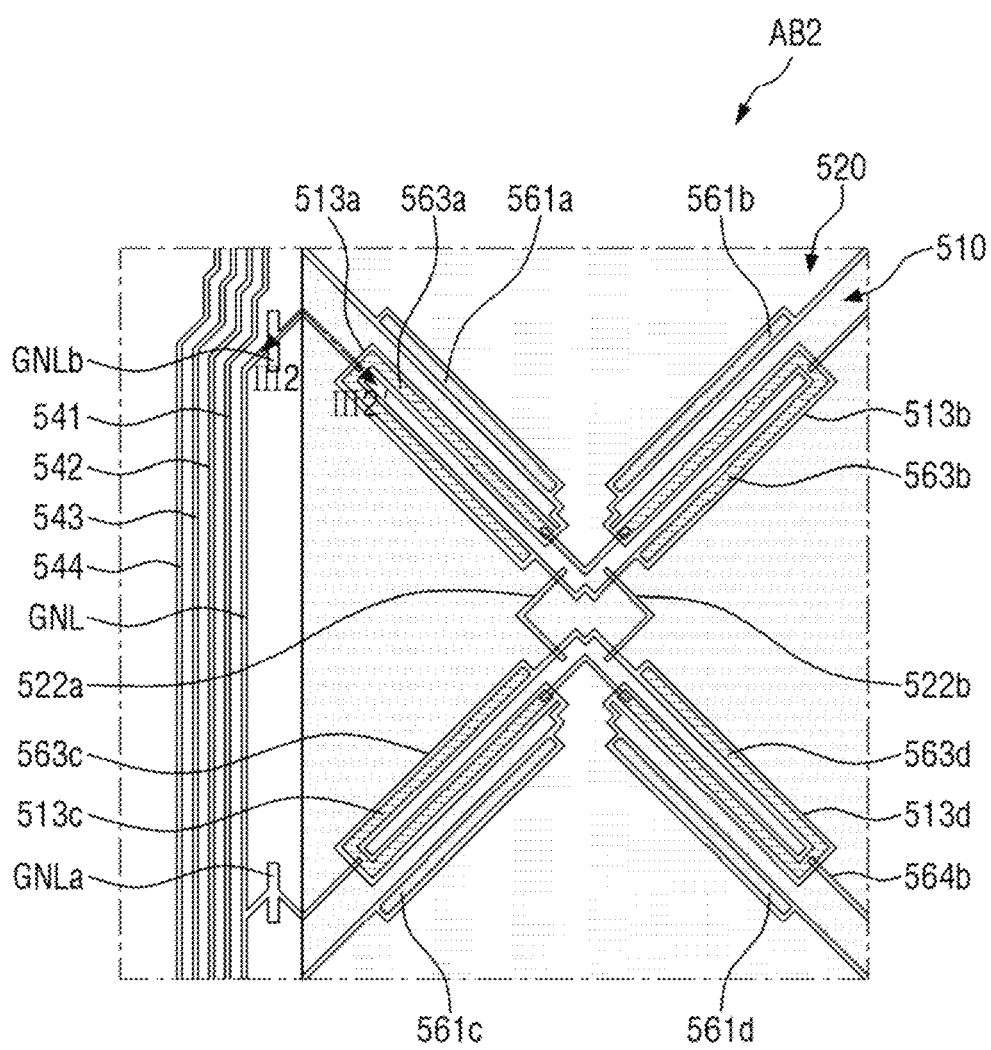
FIG. 14 is a layout view illustrating a portion corresponding to area AB2 in the touch sensing unit of FIG. 12.
Figure 15:
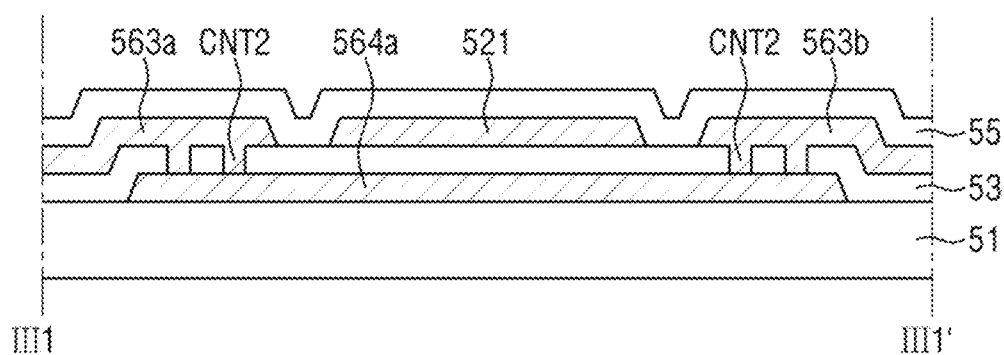
FIG. 15 is a cross-sectional view illustrating a touch sensing unit, taken along line III1-III1' of FIG. 13, according to an exemplary embodiment of the present disclosure.
Figure 16:
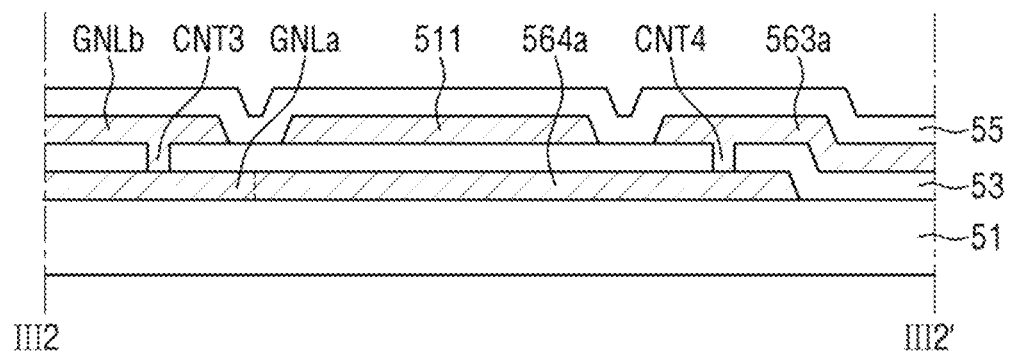
FIG. 16 is a cross-sectional view illustrating a touch sensing unit, taken along line III2-III2' of FIG. 14, according to an exemplary embodiment of the present disclosure.
Figure 17:
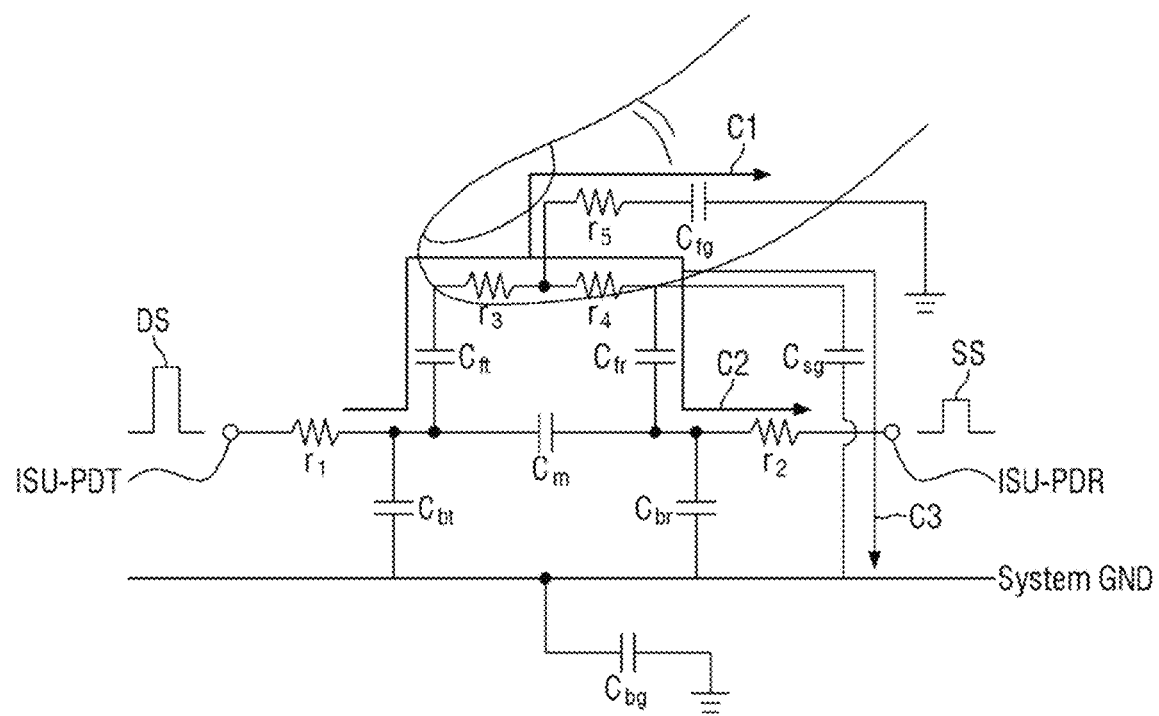
FIG. 17 is an equivalent circuit diagram illustrating a touch sensing unit when a touch event has occurred according to an exemplary embodiment of the present disclosure.

FIG. 12 is a plan view schematically showing the arrangement of a touch sensing unit according to an exemplary embodiment of the present disclosure. FIG. 13 is a layout view illustrating a portion corresponding to area AB1 in the touch sensing unit of FIG. 12. FIG. 14 is a layout view illustrating a portion corresponding to area AB2 in the touch sensing unit of FIG. 12. FIG. 15 is a cross-sectional view of the touch sensing unit 50a according to the above exemplary embodiment, taken along line III1-III1' of FIG. 13. FIG. 16 is a cross-sectional view of the touch sensing unit according to the above exemplary embodiment, taken along line III2-III2' of FIG. 14. FIG. 17 is an equivalent circuit diagram illustrating the touch sensing unit when a touch event has occurred, according to an exemplary embodiment of the present disclosure.

A touch sensing unit 50a_2, according to the exemplary embodiment shown in FIGS. 12 to 17, is substantially identical to the touch sensing unit 50a shown in FIGS. 4 and 5 except that the former further includes first dummy electrodes 561a to 561d and ground electrodes 563a to 563d. In addition, the touch sensing unit 50a_2 according to this exemplary embodiment is substantially identical to the touch sensing unit 50a_1 shown in FIGS. 10 and 11 except that second dummy electrodes 562a to 562d are replaced with ground electrodes 563a to 563d.

The touch sensing unit 50a_2 may further include a plurality of first dummy electrodes 561a to 561d and a plurality of ground electrodes 563. The plurality of first dummy electrodes 561a to 561d and the plurality of ground electrodes 563 may be formed via the same process as the first sensing electrodes 510 and the second sensing electrodes 520, and accordingly may include the same material and may have the same stacked structure.

The first dummy electrodes 561a to 561d are floating electrodes and are not electrically connected to the first sensing electrodes 510 and the second sensing electrodes 520. The plurality of ground electrodes 563 are electrically connected to the ground line GNL and are not electrically connected to the first sensing electrodes 510 and the second sensing electrodes 520.

The plurality of ground electrodes 563 may include a plurality of ground patterns and a plurality of third connection portions 564a electrically connecting the adjacent ground patterns with one another.

The plurality of ground patterns 563a to 563d may be arranged in a matrix form. For example, the first unit sensing area SUT1 may include four ground patterns 563a to 563d. The four ground patterns 563a to 563d may be arranged in a matrix of two rows and two columns. The four ground patterns 563a to 563d may have a shape that is symmetrical with respect to the imaginary center point of the first unit sensing area SUT1. The plurality of second dummy electrodes 562a to 562d described above with respect to FIGS. 10 and 11 may be replaced with the plurality of ground patterns 563a to 563d.

In an exemplary embodiment of the present disclosure, the plurality of ground patterns 563a to 563d may include the first to fourth ground patterns 563a to 563d in the first unit sensing area SUT1. The first ground pattern 563a may be disposed between the first depression 513a and the first stem sensor 523a. The second ground pattern 563b may be disposed between the second depression 513b and the second stem sensor 523b. The third ground pattern 563c may be disposed between the third depression 513c and the third stem sensor 523c. The fourth ground pattern 563d may be disposed between the fourth depression 513d and the fourth stem sensor 523d. The ground pattern 563a to 563d may have a generally U-shape and may be disposed to surround the stem sensors 523a to 523d, respectively. It is, however, to be understood that the present disclosure is not limited thereto and other arrangements may be used.

Adjacent ones of the ground patterns 563a to 563d may be electrically connected with one another by the third connection portions 564a. In an exemplary embodiment of the present disclosure, the third connection portions may connect the ground patterns (e.g., 563a and 563b) adjacent to each other in the row direction (the second direction dr2). It is, however, to be understood that the present disclosure is not limited thereto and other arrangements may be used.

The plurality of third connection portions may be formed via the same process as the plurality of second connection portions 522, and accordingly they may include the same material and may be formed in the same layer. For example, the third connection portions 564a may be formed in the first touch conductive layer 52.

The first touch insulating layer 53 may further include second contact holes CNT2 through which at least a part of the third connection portions 564a is exposed. The plurality of ground patterns 563a to 563d may be in contact with the third connection portions 564a via the second contact holes CNT2.

In an exemplary embodiment of the present disclosure, the ground line GNL may be a double-line structure. For example, in the area failing within the non-display area NDA, the ground line GNL may include a first ground line layer GNLa formed in the first touch conductive layer 52 and a second ground line layer GNLb formed in the second touch conductive layer 54.

The first touch insulating layer 53 may include a plurality of third contact holes CNT3 through which at least a part of the first ground line layer GNLa is exposed. The first ground line layer GNLa and the second ground line layer GNLb may be in contact with each other via the third contact holes CNT3 of the first touch insulating layer 53.

On the other hand, the ground patterns adjacent to the ground line GNL are connected to one another and may be connected to at least one of the first ground line layer GNLa and the second ground line layer GNLb. For example, the first ground line layer GNLa may be in contact with the ground pattern. In such case, the first ground line layer GNLa may be extended to an area falling within the display area DA1, and may be in contact with the ground patterns via the fourth contact holes of the first touch insulating layer 53 through which at least a part of the first ground line layer GNLa is exposed.

The spacing between the depressions 513a to 513d of the first sensing electrodes 510 and the stem sensors 523a to 523d can be adjusted by the ground patterns, so that a change in the capacitance $\Delta C_m$ of the touch sensing unit 50a_2 can be adjusted.

Since the plurality of ground patterns 563a to 563d and the ground line GNL are all electrically connected, the plurality of ground patterns 563a to 563d may be applied with the third reference voltage signal.

A capacitance Csg between the input means and the system ground (System GND) can be formed. As a result, noise (so-called "re-transmission") may occur.

A plurality of ground patterns applied with the third reference voltage signal, whose voltage level is lower than that of the first reference voltage signal and the second reference voltage signal, is disposed between the first sensing electrodes 510 to which the first reference voltage signal is applied and the second sensing electrodes 520 to which the second reference voltage signal is applied, such that signal may flow to the system ground (System GND) along the third path C3. The noise (re-transmission) may be moved to the system ground (System GND) along to the third path C3.

For example, the amount of signal moving along the second path C2 can be relatively reduced, and noise (so-called re-transmission) can be reduced. Therefore, the sensitivity ($\Delta C_m/C_m$) of the capacitance of the touch sensing unit 50a_2 can be increased.

For example, by disposing the first dummy electrodes 561a to 561d and the ground patterns 563a to 563d, the area occupied by the first sensing electrodes 510 and the second sensing electrodes 520 becomes relatively small, such that the noise can be reduced. As the area occupied by the first sensing electrodes 510 and the second sensing electrodes 520 is reduced, a change in the capacitance $C_m$ can be reduced. However, by increasing the length of the boundary lines between the depressions 513a to 513d of the first sensing patterns and the stem sensors 523a to 523d, it is possible to further reduce a change in the capacitance $\Delta C_m$. In addition, by disposing the ground patterns 563a to 563d between the depressions 513a to 513d of the first sensing electrodes 510 and the stem sensors 523a to 523d, the noise can be reduced, so that the sensitivity of the capacitance $\Delta C_m/C_m$ can be increased.

Figure 18:
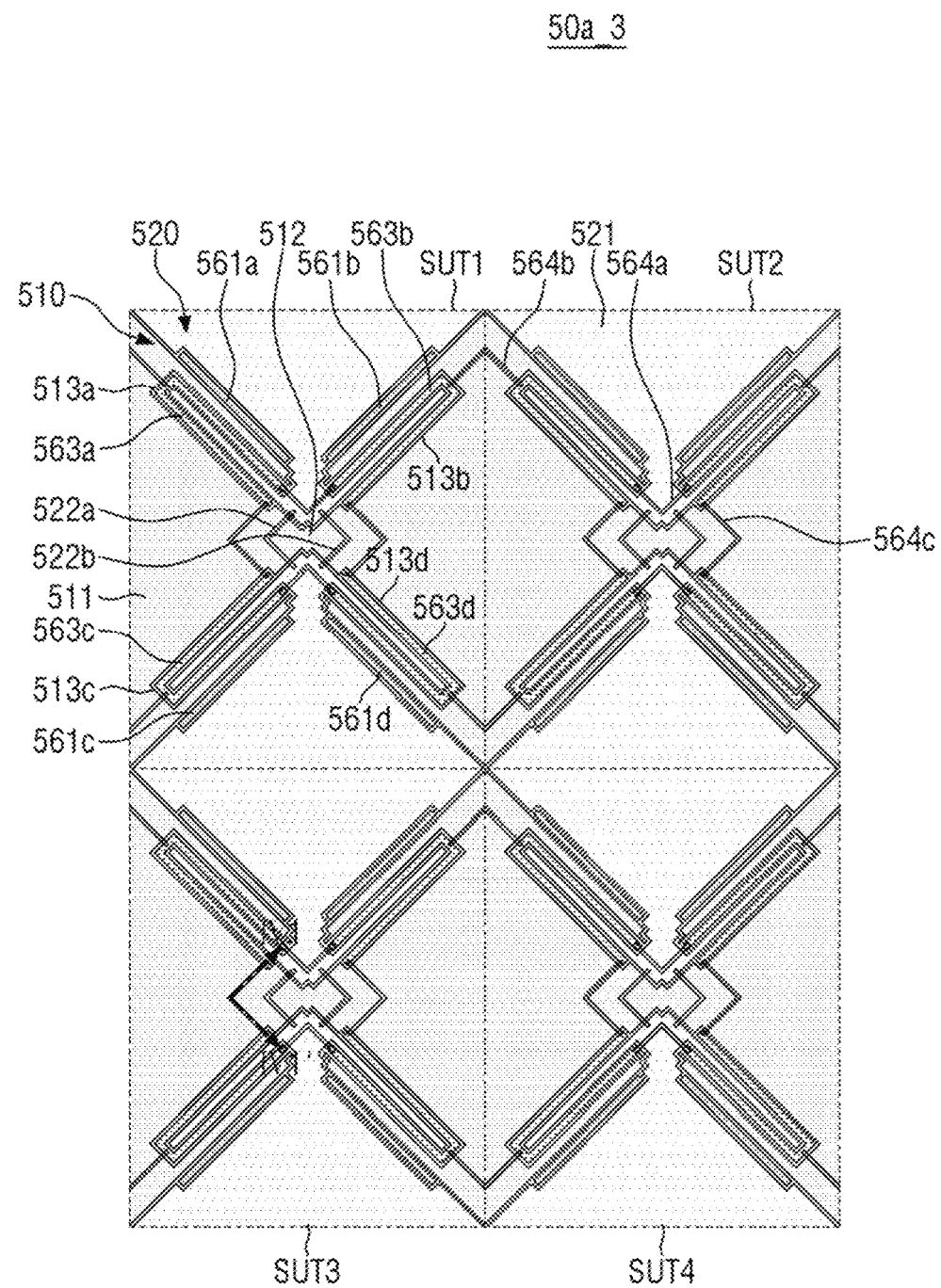
FIG. 18 is a layout view illustrating a part of a touch sensing unit according to an exemplary embodiment of the present disclosure.
Figure 19:
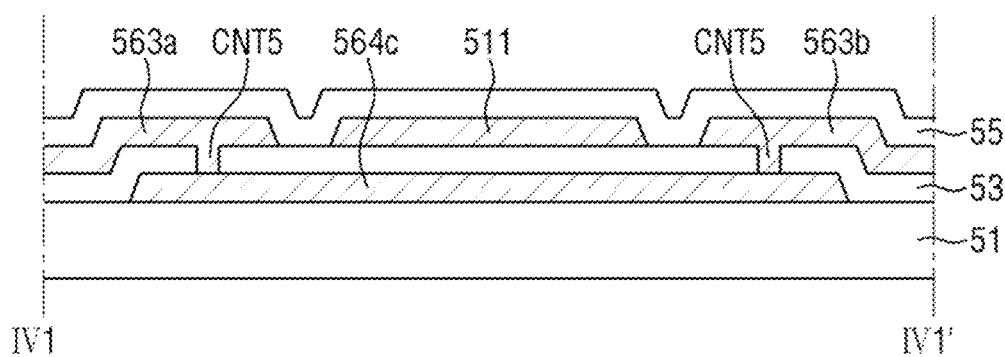
FIG. 19 is a cross-sectional view of a touch sensing unit, taken along line IV1-IV1' of FIG. 18, according to an exemplary embodiment of the present disclosure.

FIG. 18 is a layout view illustrating a part of a touch sensing unit according to an exemplary embodiment of the present disclosure. FIG. 19 is a cross-sectional view of the touch sensing unit according to the above exemplary embodiment, taken along line IV1-IV1' of FIG. 18.

A touch sensing unit 50a_3, according to the exemplary embodiment shown in FIGS. 18 and 19, is substantially identical to the touch sensing unit 50a_2 of FIGS. 13 and 15 except that the former further includes fourth connection portions 564b connecting ground patterns adjacent to each other in the column direction (the first direction dr1) (e.g., ground patterns 563a and 563c) with each other in a single unit sensing area SUT1.

In the first unit sensing area SUT1, the touch sensing unit 50a_3 may further include a plurality of fourth connection portions 564b that connects the first ground pattern 563a with the third ground pattern 563c and connects the second ground pattern 563b with the fourth ground pattern 563d. The plurality of fourth connection portions 564b may be formed via the same process as the plurality of third connection portions 564a and the plurality of second connection portions 522, and accordingly they may include the same material and may be formed in the same layer. For example, the fourth connection portions 564b may be formed in the first touch conductive layer 52.

The first touch insulating layer 53 may further include fifth contact holes CNT5 through which at least a part of the fourth connection portions 564b is exposed. The plurality of ground patterns 563a to 563d adjacent to one another in the column direction (the first direction dr1) may be in contact with the third connection portions 564a via the fifth contact holes CNT5 in a single unit sensing area.

Figure 20:
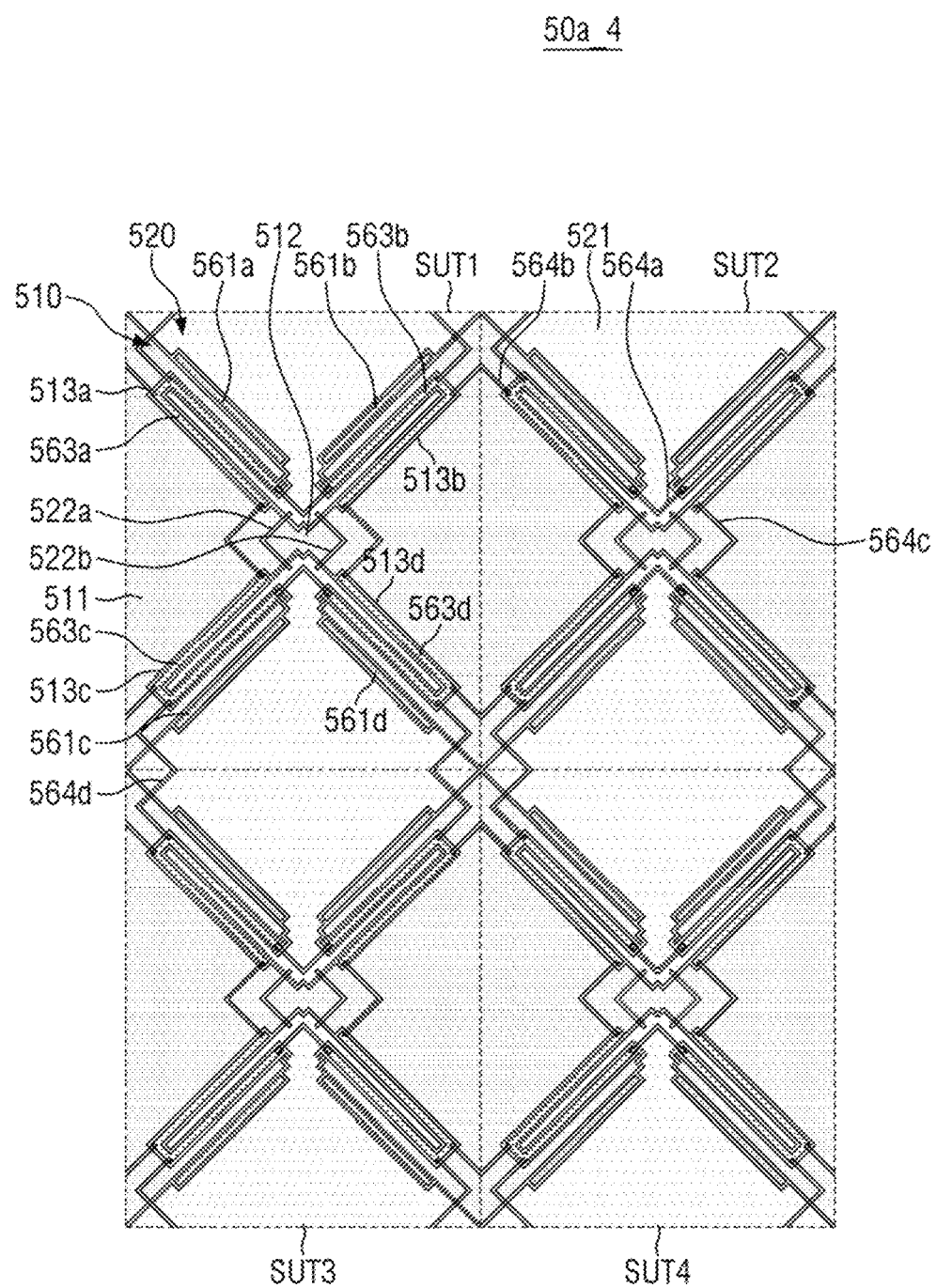
FIG. 20 is a layout view illustrating a part of a touch sensing unit according to an exemplary embodiment of the present disclosure.

FIG. 20 is a layout view illustrating a part of a touch sensing unit according to an exemplary embodiment of the present disclosure.

A touch sensing unit 50a_4, according to the exemplary embodiment shown in FIG. 20, is substantially identical to the touch sensing unit 50a_3 of FIG. 18 except that the former further includes fourth connection portions 564c connecting the ground patterns included in the unit sensing areas adjacent to each other in the column direction (the first direction dr1) (e.g., unit sensing areas SUT1 and SUT3) with each other.

The touch sensing unit 50a_4 may further include a plurality of fifth connection portions 564c included in each of the unit sensing areas adjacent to one another in the column direction (the first direction dr1) and connecting a plurality of ground patterns adjacent to one another in the column direction (the first direction dr1). The plurality of fifth connection portions 564c may be formed via the same process as the plurality of second to fourth connection portions 522, 564a and 564b, and accordingly they may include the same material and may be formed in the same layer. For example, the fifth connection portions 564c may be formed in the first touch conductive layer 52.

Figure 21:
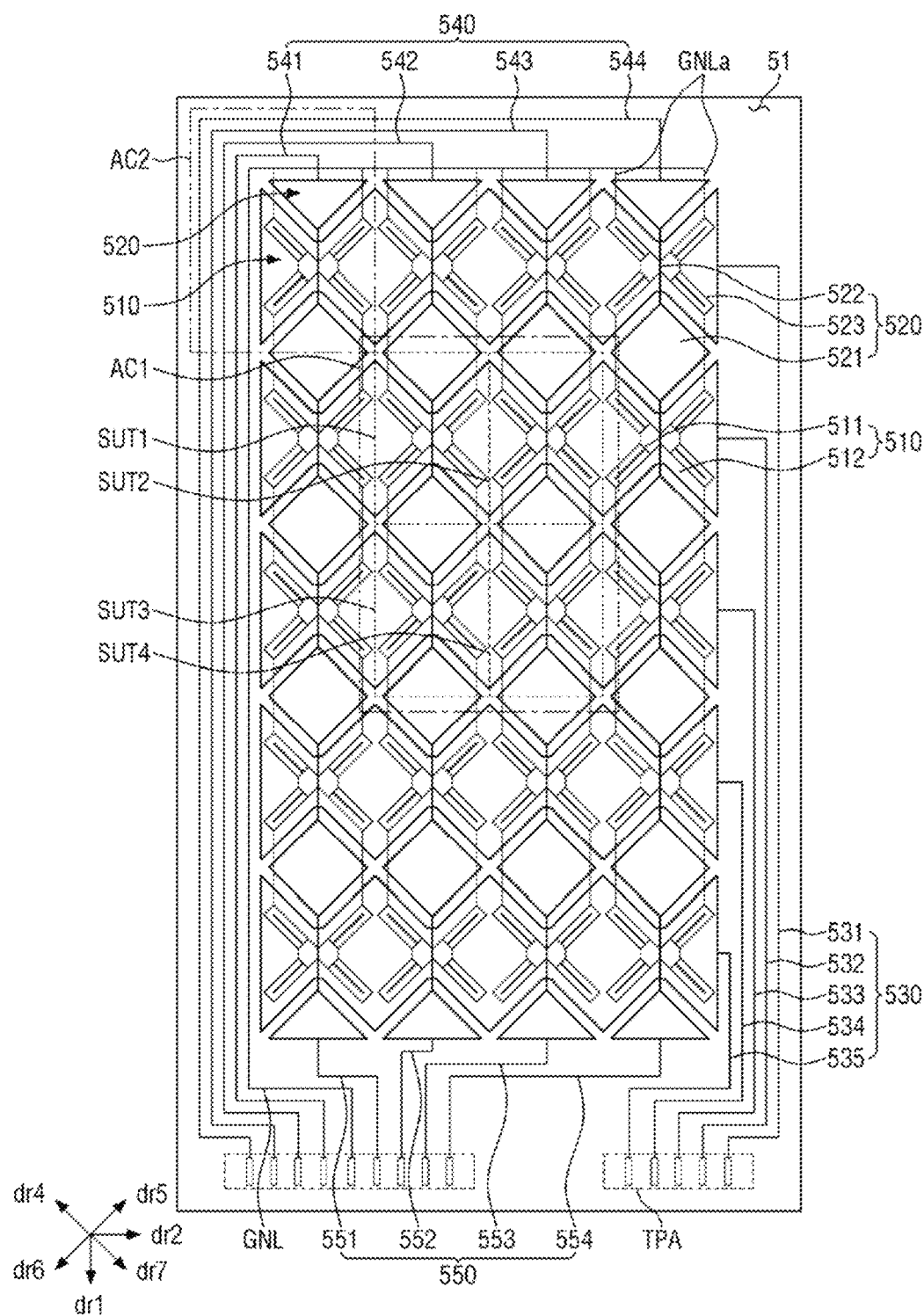
FIG. 21 is a plan view schematically illustrating an arrangement of a touch sensing unit according to an exemplary embodiment of the present disclosure.
Figure 22:
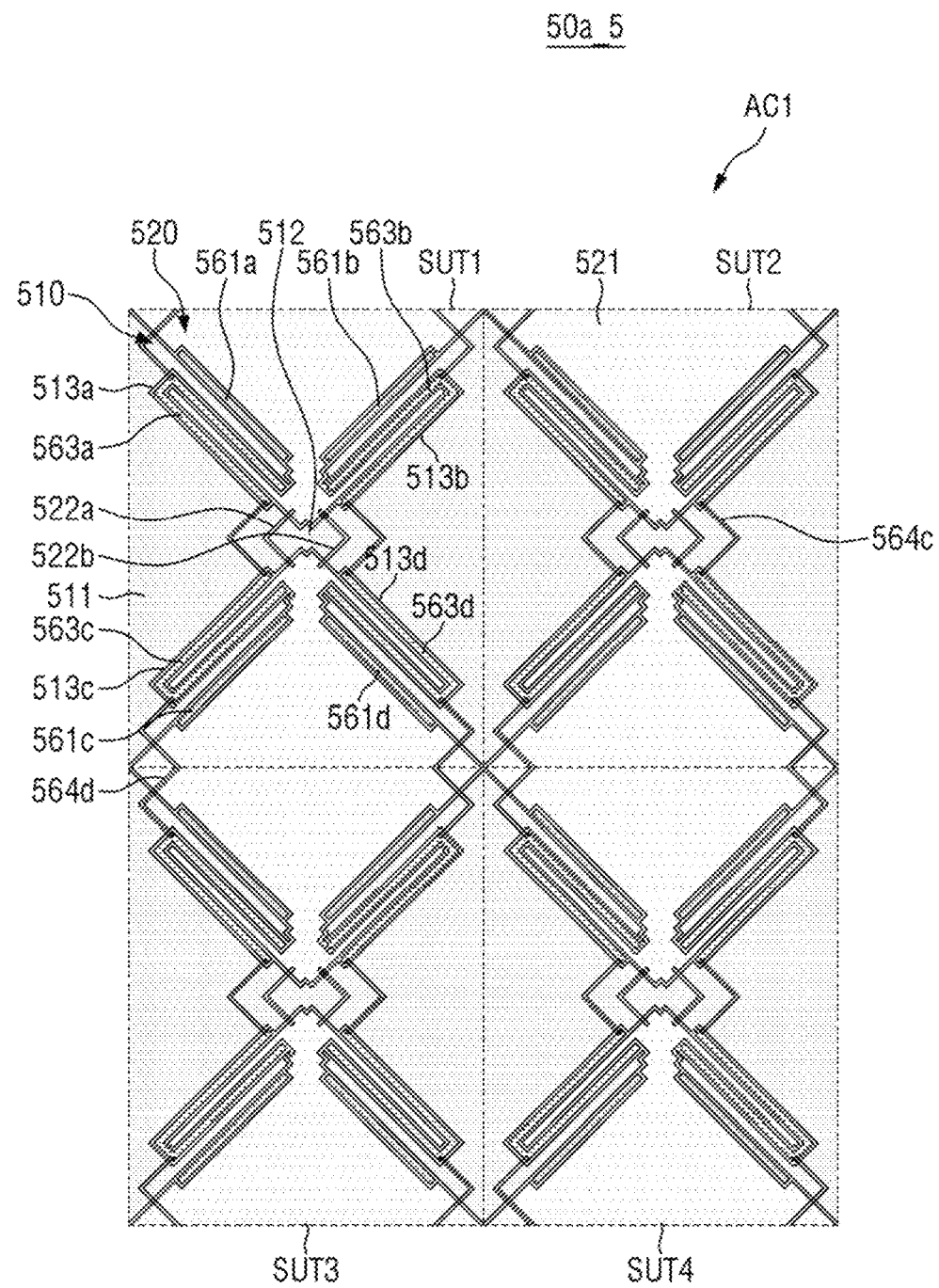
FIG. 22 is a layout view illustrating a portion corresponding to area AC1 in the touch sensing unit of FIG. 21.
Figure 23:
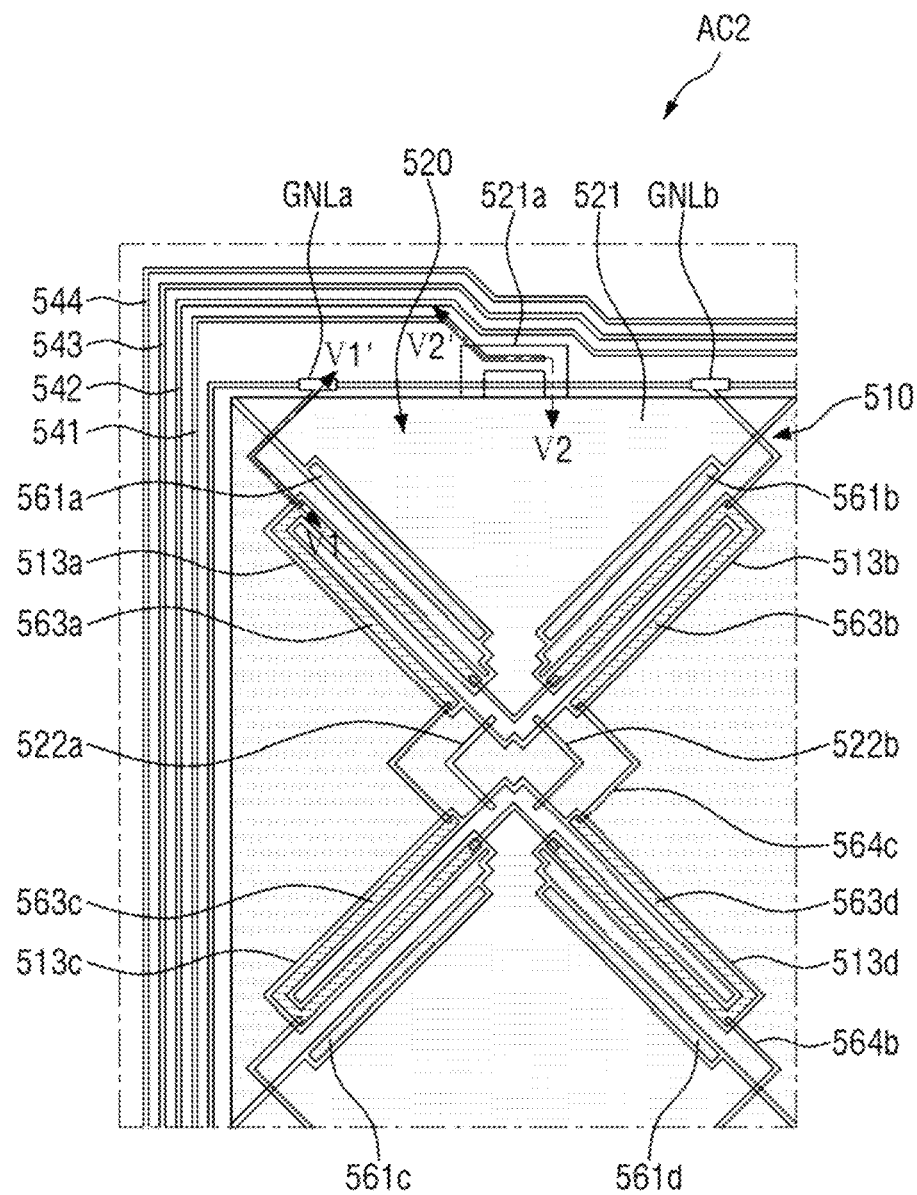
FIG. 23 is a layout view illustrating a portion corresponding to area AC2 in the touch sensing unit of FIG. 21.
Figure 24:
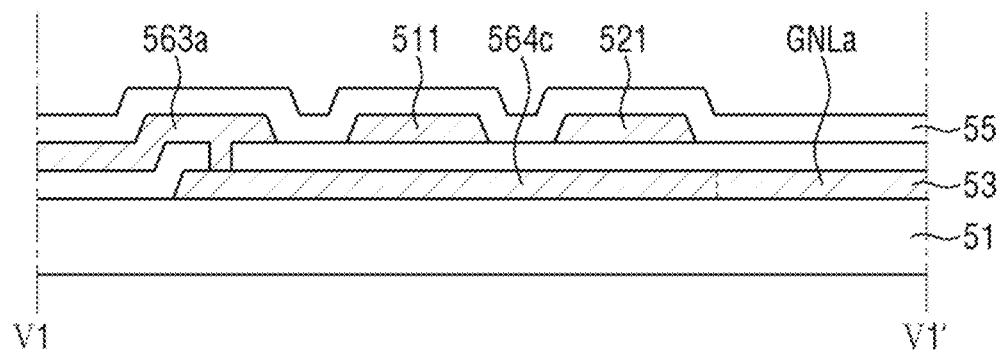
FIG. 24 is a cross-sectional view illustrating a touch sensing unit, taken along line V1-V1' of FIG. 23, according to an exemplary embodiment of the present disclosure.
Figure 25:
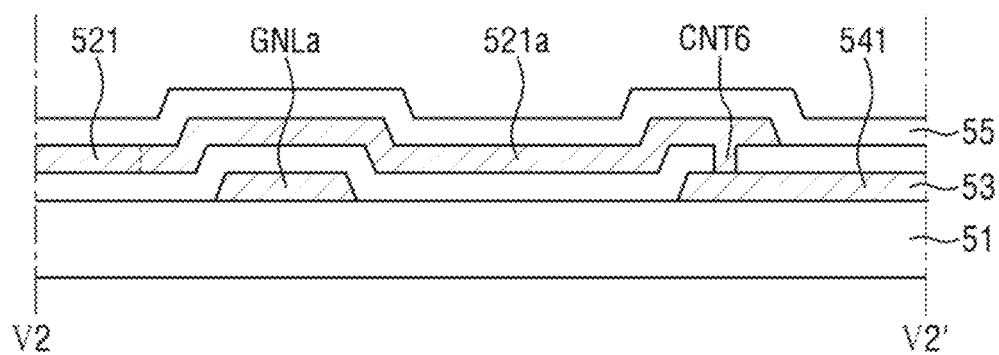
FIG. 25 is a cross-sectional view illustrating a touch sensing unit, taken along line V2-V2' of FIG. 23, according to an exemplary embodiment of the present disclosure.

FIG. 21 is a plan view schematically illustrating the arrangement of the touch sensing unit according to an exemplary embodiment of the present disclosure. FIG. 22 is a layout view illustrating a portion corresponding to area AC1 in the touch sensing unit of FIG. 21. FIG. 23 is a layout view illustrating a portion corresponding to area AC2 in the touch sensing unit of FIG. 21. FIG. 24 is a cross-sectional view illustrating the touch sensing unit according to the above exemplary embodiment, taken along line V1-V1' of FIG. 23. FIG. 25 is a cross-sectional view of the touch sensing unit according to the above exemplary embodiment, taken along line V2-V2' of FIG. 23.

A touch sensing unit 50a_5 according to the exemplary embodiment shown in FIGS. 21 to 25 is substantially identical to the touch sensing unit 50a_4 of FIG. 20 except that the third connection portions 564a are omitted and the arrangement of a ground line GNL is different.

The ground line GNL may be extended to the upper edge as well as the left edge of the area falling within the non-display area NDA. The ground line GNL may be disposed between the third signal lines 550 and the plurality of sensing electrodes 510 and 520 at the left edge. The ground line GNL may be disposed so as to intersect a sensing electrode extension 521a at the upper edge.

The sensing electrode extension 521a may work as a bridge electrode connecting the second sensing electrodes 520 with the third signal lines 550. The extension of the second sensing electrodes 520 may be formed in the second touch conductive layer 54 and may be extended from first ends of the second sensing electrodes 520 to the area falling within the non-display area NDA.

The first touch insulating layer 53 may include a plurality of sixth contact holes CNT6 through which at least a pan of the second ground lines 540 (e.g., 541) is exposed. The sensing electrode extension may be in contact with the second signal lines 540 via the sixth contact holes CNT6 of the first touch insulating layer 53.

The ground line GNL may be connected to the ground patterns adjacent to the ground line GNL in the region disposed at the upper edge. The ground line GNL may traverse the sensing electrode extension 521a in a region disposed at the upper edge. The ground line GNL may be insulated from the sensing electrode extension 521a.

The ground line GNL may include a double-line structure at the left edge and a single-line structure at the upper edge. In an exemplary embodiment of the present disclosure, the ground line GNL at the upper edge may include only the first ground line layer GNLa. The ground line GNL may be insulated from the sensing electrode extension at the upper edge, and the first ground line layer GNLa may be extended to the area falling within the display area DA1 to be connected to the ground patterns.

The plurality of ground patterns can maintain the electrical connection with the ground line GNL even if the third connection portions 564a, according to the above exemplary embodiment of the present disclosure, are omitted.

It is to be noted that the arrangement of the ground line GNL is not limited to that shown in the drawings. The ground line GNL may be disposed so as to intersect with the third signal lines 550 at the upper edge. In such case, the ground line GNL may be disposed in the second touch conductive layer 54, and the third signal lines 550 may be disposed in the first touch conductive layer 52 and insulated from ore another. In addition, the ground line GNL and the ground patterns may be connected to one another through the fifth connection portions 564*c*.

Figure 26:
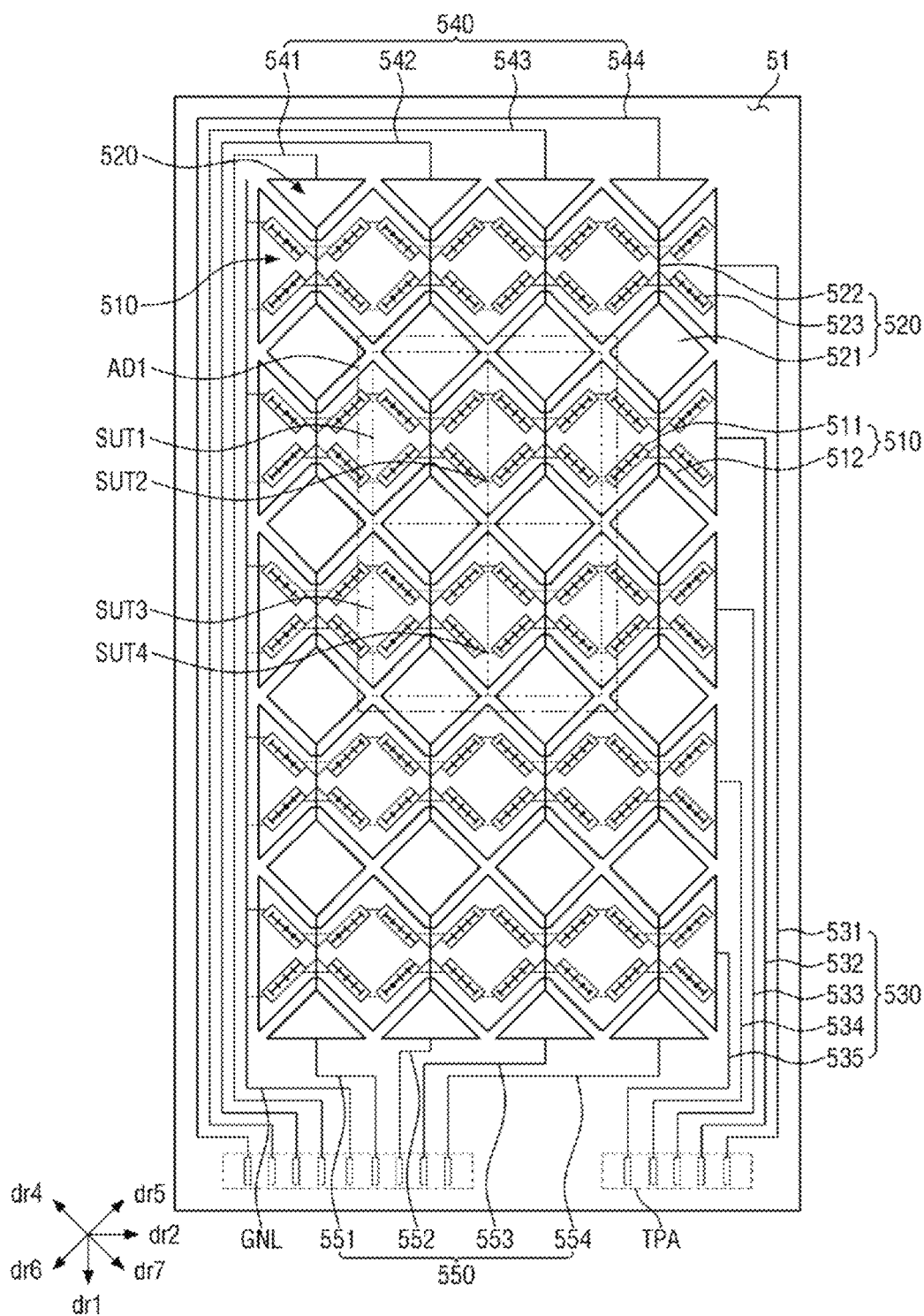
FIG. 26 is a plan view schematically illustrating an arrangement of a touch sensing unit according to an exemplary embodiment of the present disclosure.
Figure 27:
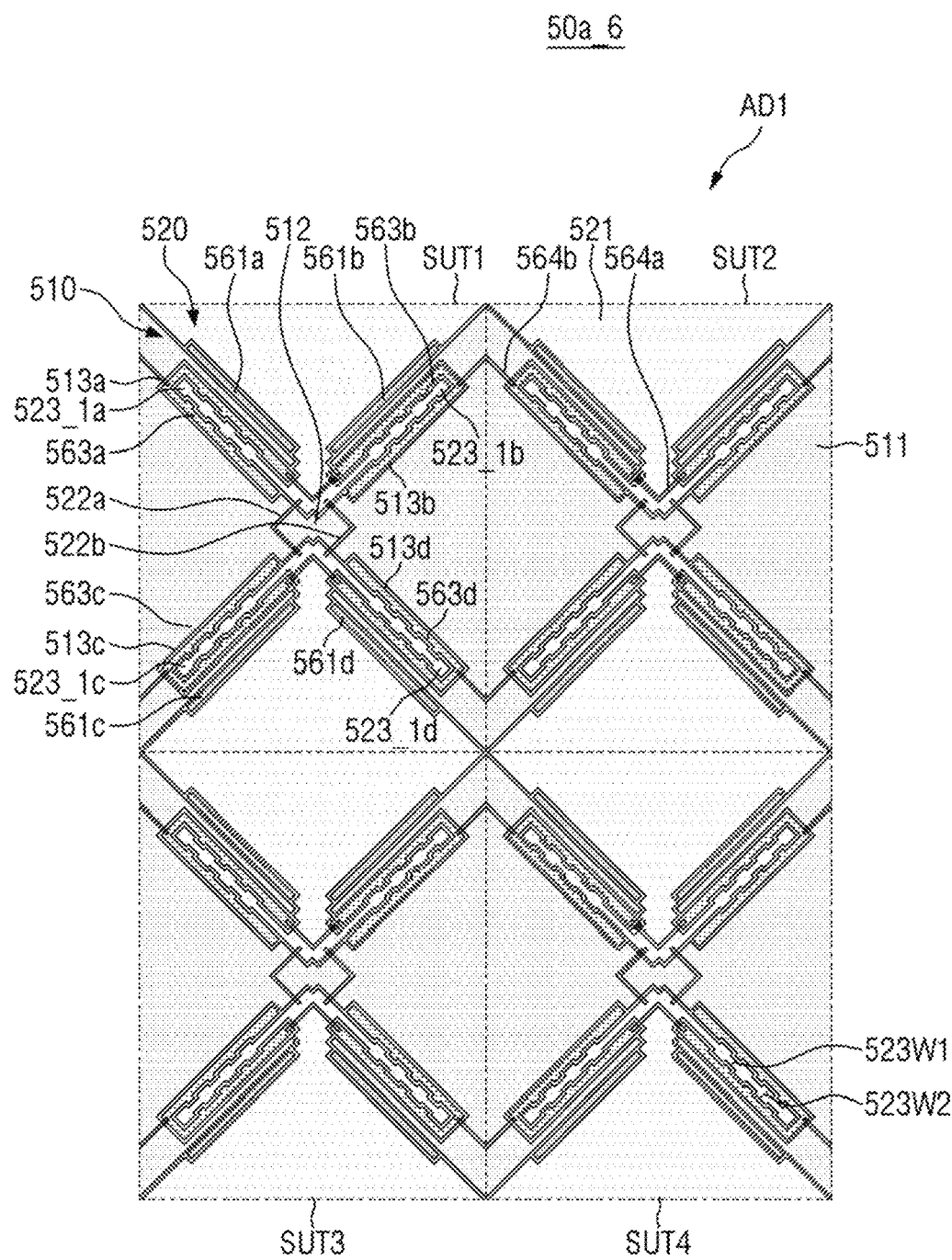
FIG. 27 is a layout view illustrating a portion corresponding to area AD1 of the touch sensing unit of FIG. 26.

FIG. 26 is a plan view schematically illustrating the arrangement of the touch sensing unit according to an exemplary embodiment of the present disclosure. FIG. 27 is a layout view illustrating a portion corresponding to area AD1 in the touch sensing unit of FIG. 26.

A touch sensing unit 50*a*_6, according to the exemplary embodiment shown in FIGS. 26 and 27, is substantially identical to the touch sensing unit 50*a*_2 shown in FIGS. 12 and 13 except for the shape of stem sensors 523*a* to 523*d*.

One of the stem sensors (e.g., a stem sensor 523*a*) may include one or more regions having different widths. For example, one of the stem sensors 523*a* to 523*d* may have a shape whose width alternates between being small and large in the direction that it is extended. One of the stem sensors 523*a* to 523*d* may include a first width 523W1 and a second width 523W2 that is larger than the first width 523W1. In an exemplary embodiment of the present disclosure, the first width 523W1 may range approximately from 50 to and 150 μm, and the second width 523W2 may range approximately from 150 to 200 μm. For example, the stem sensors 523*a* to 523*d* may have a shape including saw-tooth-like longer sides.

The shape of the ground patterns 563*a* to 563*d* may substantially conform to the shape of the border of the stem sensors 523*a* to 523*d*. For example, the outer border of the ground patterns 563*a* to 563*d* may conform to the shape of the border of the depressions 513*a* to 513*d*, and the inner border of the ground patterns 563*a* to 563*d* may conform to the shape of the border of the stem sensors 523*a* to 523*d*, which has a saw-tooth shape.

The length of the boundary lines between the first sensing electrodes 510 and the second sensing electrodes 520 can be increased by the stem sensors 523*a* to 523*d*. Accordingly, it is possible to further reduce a change in the capacitance $\Delta C_m$.

Although the shape of the border of the depressions 513*a* to 513*d* is shown as being a straight line in the drawings, this is merely illustrative. The shape of the border of the depressions 513*a* to 513*d* may conform to the shape of the stem sensors 523*a* to 523*d*, which has a saw-tooth shape.

Hereinafter, modifications of this exemplary embodiment will be described with reference to FIGS. 28 to 31.

Figure 28:
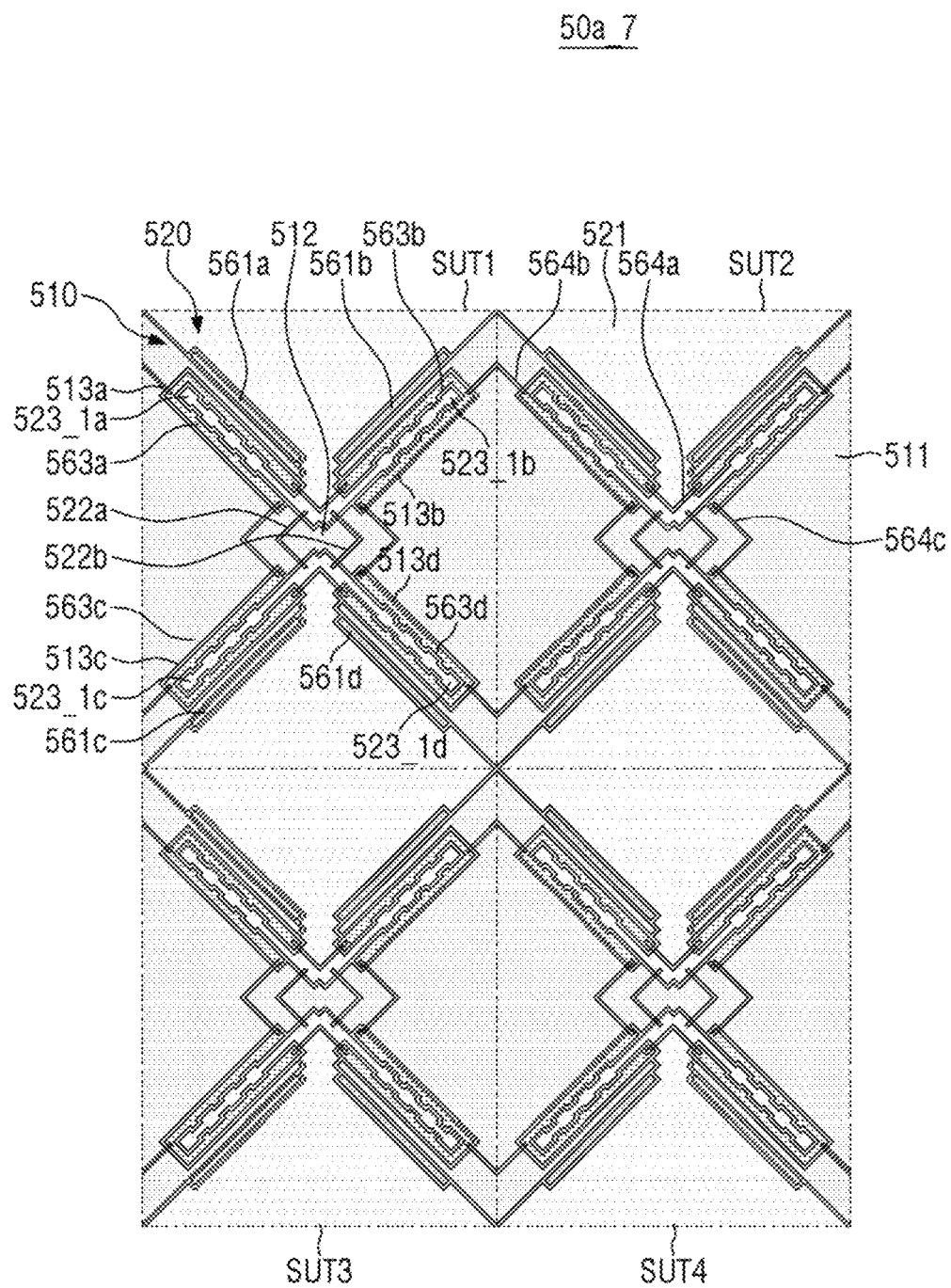
FIGS. 28 and 29 are layout views illustrating a part of touch sensing units according to exemplary embodiments of the present disclosure.
Figure 29:
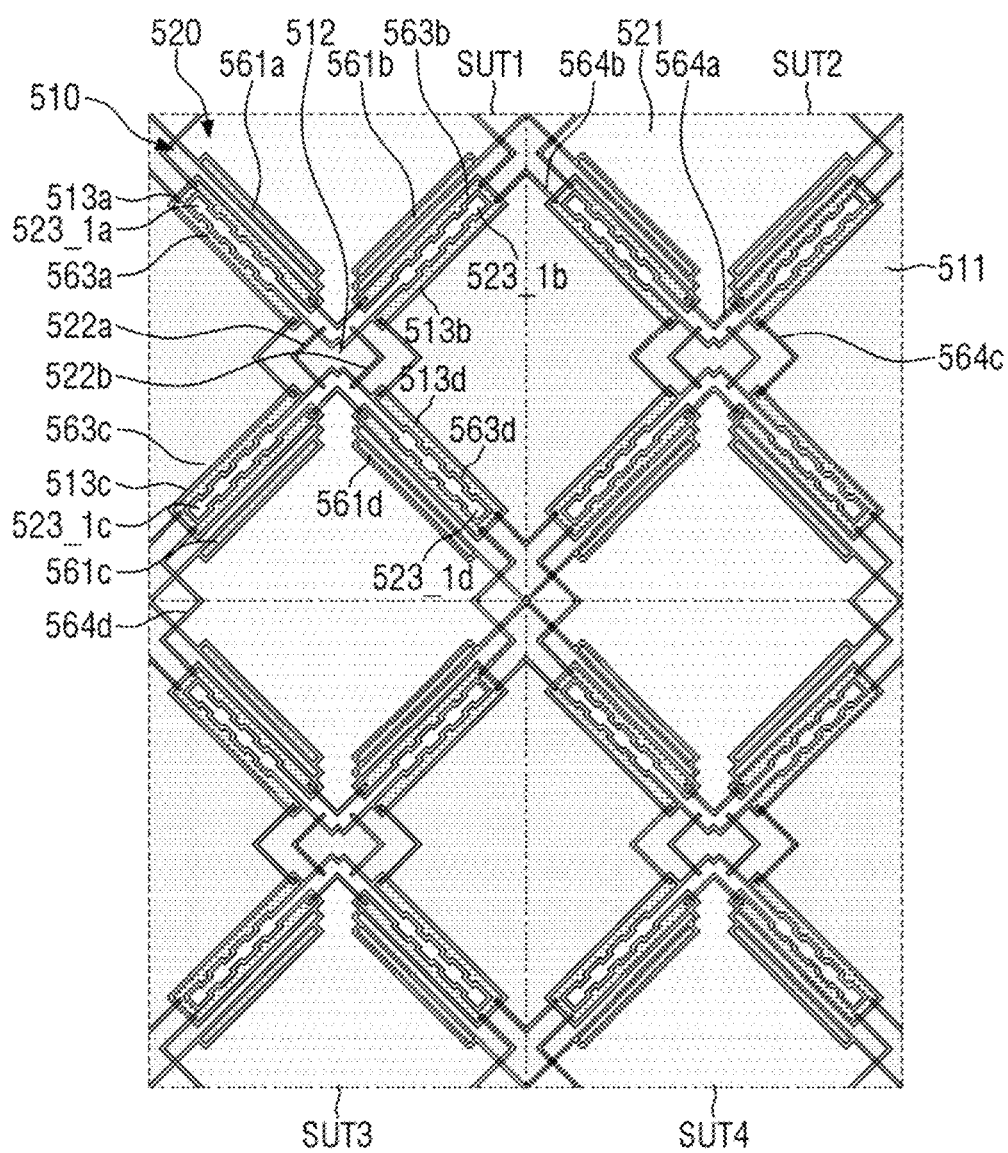

FIGS. 28 and 29 are layout views illustrating a part of touch sensing units according to exemplary embodiments of the present disclosure.

Touch sensing units 50*a*_7 and 50*a*_8, according to the exemplary embodiments shown in FIGS. 28 and 29, are substantially identical to the touch sensing unit 50*a*_6 shown in FIG. 27 except that the formers further include at least one of third to fifth connection portions 564*a* to 564*c*.

The touch sensing units 50*a*_7 and 50*a*_8, according to the exemplary embodiments, are substantially identical to those described above with reference to FIGS. 18 and 20 except for the shape of the ground lines GNL; and, therefore, the redundant description will be omitted.

Figure 30:
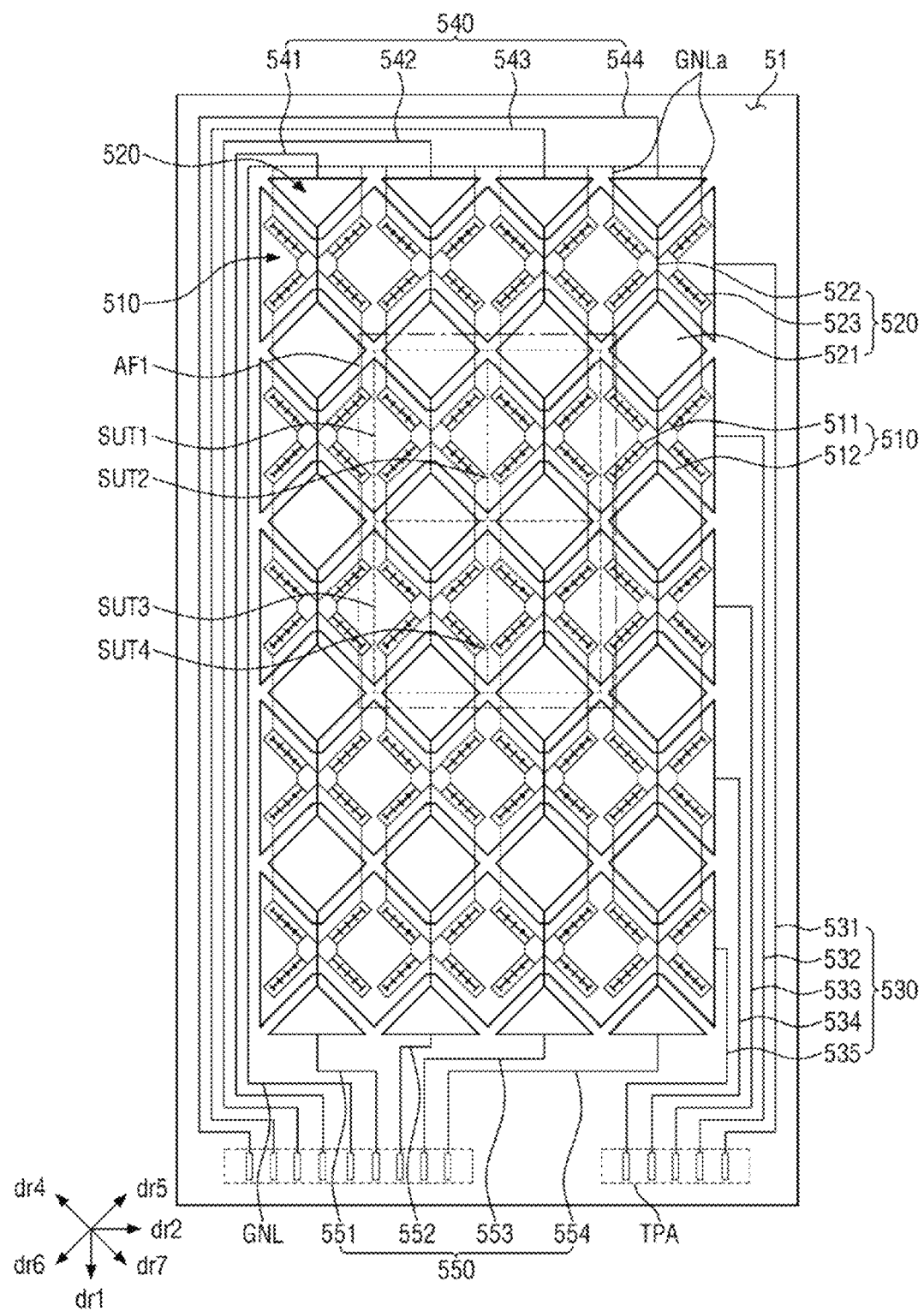
FIG. 30 is a plan view schematically illustrating an arrangement of a touch sensing unit according to an exemplary embodiment of the present disclosure.
Figure 31:
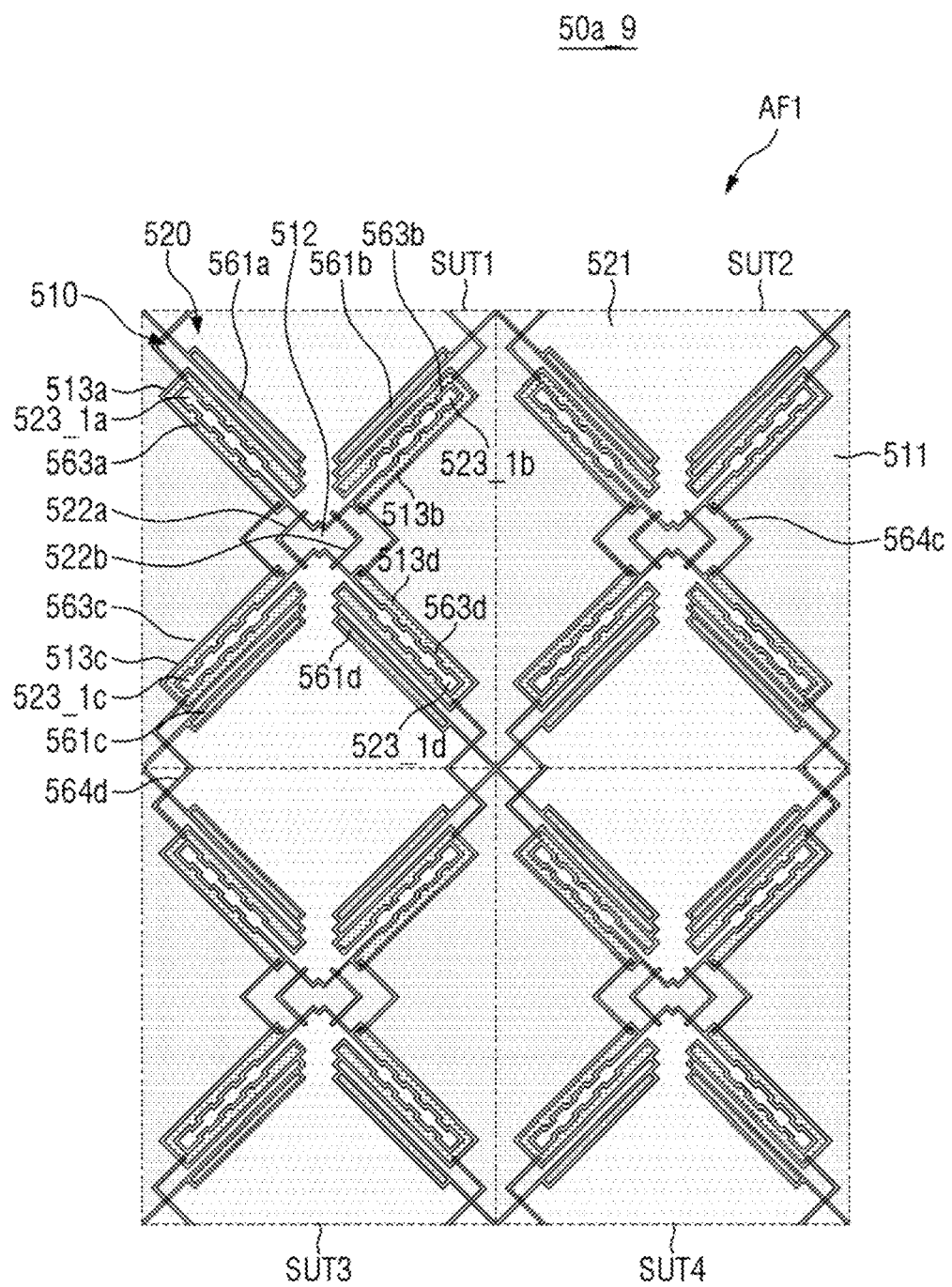
FIG. 31 is a layout view illustrating a portion corresponding to area AF1 of the touch sensing unit of FIG. 30.

FIG. 30 is a plan view schematically illustrating the arrangement of the touch sensing unit according to an exemplary embodiment of the present disclosure. FIG. 31 is a layout view illustrating a portion corresponding to area AF1 in the touch sensing unit of FIG. 30.

A touch sensing unit 50*a*_9, according to the exemplary embodiment shown in FIGS. 30 and 31, is substantially identical to the touch sensing unit 50*a*_6 shown in FIG. 27 except that the arrangement of a ground line GNL is different and that at least one of the third to fifth connection portions 564*a* to 564*c* is further included.

The touch sensing unit 50*a*_9, according to the exemplary embodiment, is substantially identical to that described above with reference to FIGS. 21 and 22 except for the shape of the ground line GNL; and, therefore, the redundant description will be omitted.

Figure 32:
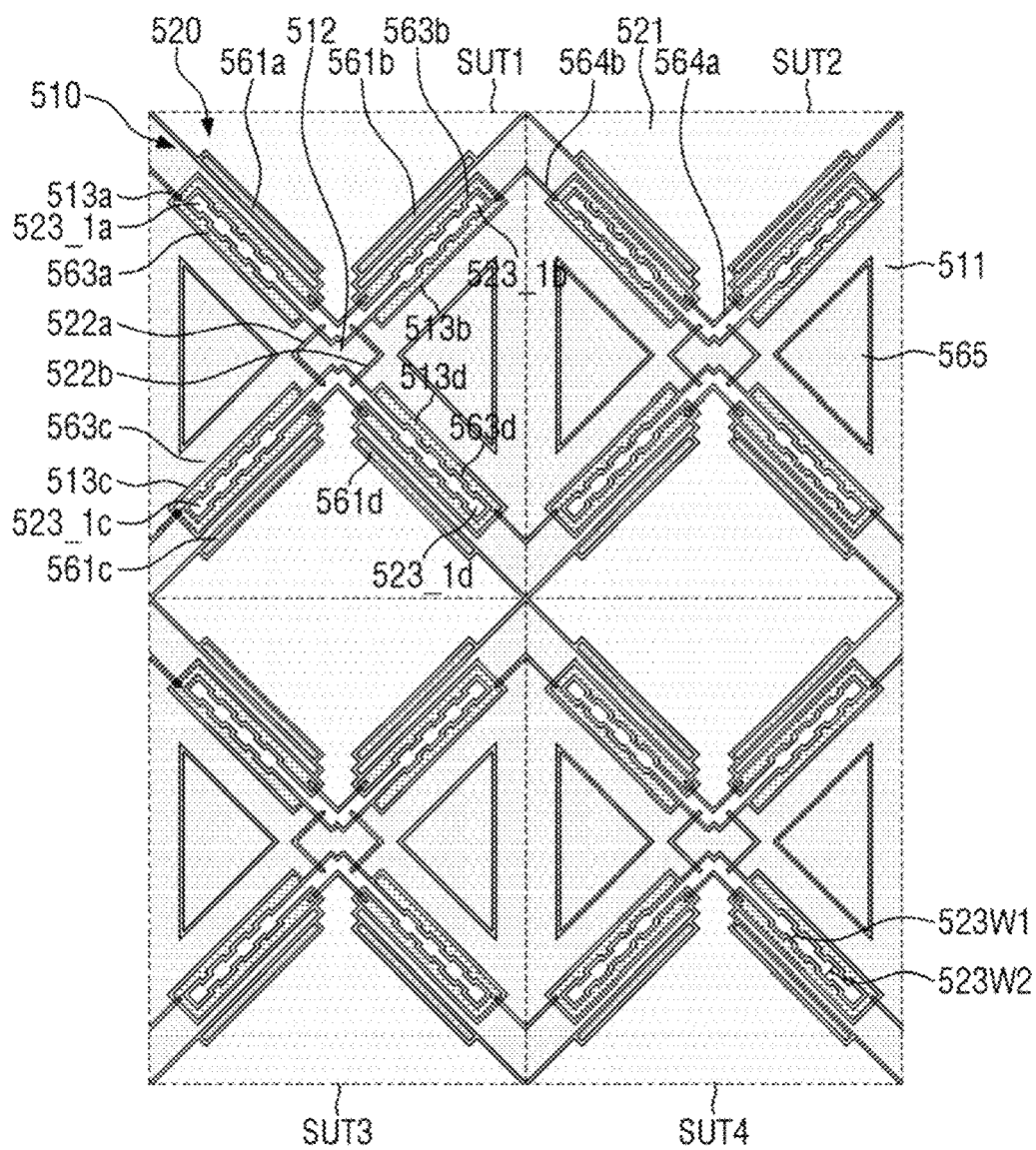
FIG. 32 is a layout view illustrating a part of touch sensing units according to an exemplary embodiment of the present disclosure.

FIG. 32 is a layout view illustrating a part of touch sensing units according to an exemplary embodiment of the present disclosure.

A touch sensing unit 50*a*_10, according to the exemplary embodiment shown in FIG. 32, is substantially identical to the touch sensing unit 50*a*_6 of FIG. 27 except that the former further includes third dummy electrodes 565.

The touch sensing unit 50*a*_10 may further include third dummy electrodes 565. The third dummy electrodes 565 are disposed inside the first sensor portions 511 and may be spaced apart from the first sensor portions 511. The third dummy electrodes 565 may be formed via the same process as the first and second sensor portions 521 and the first and second dummy electrodes 565*a* and 562*d*, and accordingly may include the same material and may be formed in the same layer. For example, the third dummy electrodes 565 may be formed in the second touch conductive layer 54.

The third dummy electrodes 565 may have a variety of locations and shapes. Although one first sensor portion 511 includes two third dummy electrodes 565 and the third dummy electrodes 565 have a generally triangular shape in FIG. 32, this is merely illustrative.

By disposing the third dummy electrodes 565 in the first sensor portions 511, the overlapping area between the input means (e.g., a user's finger) and the first sensor portions 511 is reduced Accordingly, the touch capacitances $C_{ft}$ and $C_{fr}$ can be reduced. As a result, it is possible to increase a change in the capacitance $\Delta C_m$ before and after an input from the input means. In addition, the overlap area with the system ground (System GND) is reduced. As a result, it is possible to reduce the influence by the fluctuation of the system ground (System GND).

In order to adjust a change in the capacitance $\Delta C_m$, the area occupied by the third dummy electrodes 565 may be adjusted, such that the area of the first sensor portions 511 can be adjusted.

Figure 33:
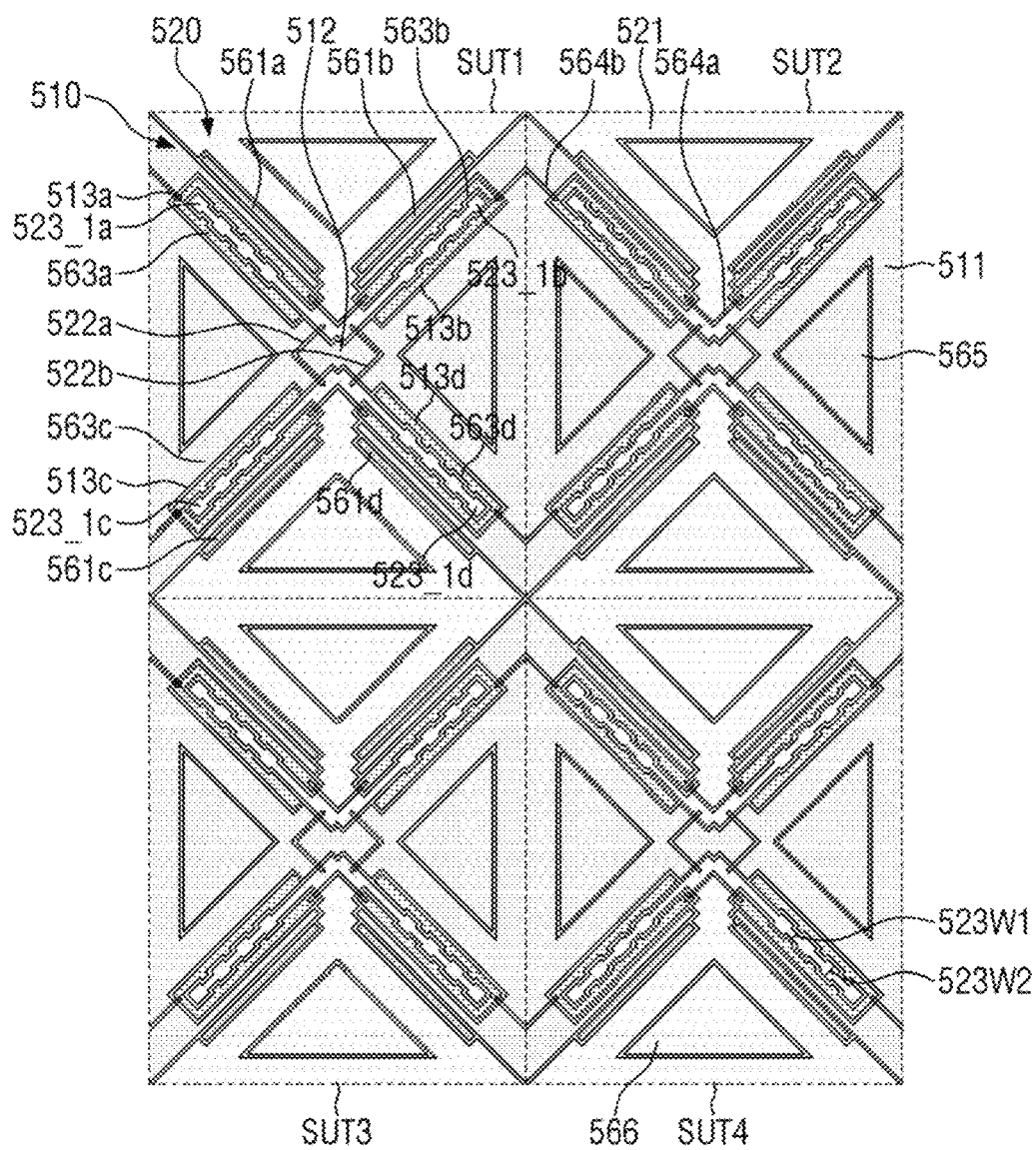
FIG. 33 is a layout view illustrating a part of a touch sensing unit according to an exemplary embodiment of the present disclosure.

FIG. 33 is a layout view illustrating a part of a touch sensing unit according to an exemplary embodiment of the present disclosure.

A touch sensing unit 50*a*_11, according to this exemplary embodiment shown in FIG. 33, is substantially identical to the touch sensing unit 50*a*_10 of FIG. 32 except that the former further includes fourth dummy electrodes 566.

The touch sensing unit 50*a*_11 may further include fourth dummy electrodes 566. The fourth dummy electrodes 566 may be disposed inside the second sensor portions 521 and may be spaced apart from the second sensor portions 521. The fourth dummy electrodes 566 may be formed via the same process as the first and second sensor portions 521 and the first to third dummy electrodes 565, and accordingly may include the same material and may be formed in the same layer. For example, the fourth dummy electrodes 566 may be formed in the second touch conductive layer 54.

The location and shape of the fourth dummy electrodes 566 may vary. Although one second sensor portion 521 includes two fourth dummy electrodes 566 and the fourth dummy electrodes 566 have a generally triangular shape in FIG. 33, this is merely illustrative and the fourth dummy electrodes 566 may have different shapes.

By disposing the third dummy electrodes 565 and the fourth dummy electrodes 566 in the first sensor portions 511 and the second sensor portions 521, respectively, the area where the input means overlaps with the first sensor portions 511 and the second sensor portions 521 is reduced. Accordingly, the touch capacitances $C_{f1}$ and $C_{f2}$ can be reduced. As a result, it is possible to increase a change in the capacitance $\Delta C_m$ before and after an input from the input means. In addition, by disposing the third dummy electrodes 565 and the fourth dummy electrodes 566 in the first sensor portions 511 and the second sensor portions 521, respectively, the overlapping area with the system ground (System GND) is reduced. As a result, it is possible to reduce the influence by the fluctuation of the system ground (System GND).

To adjust a change in the capacitance $\Delta C_m$, the area occupied by the fourth dummy electrodes 566 may be adjusted, such that the area of the second sensor portions 521 can be adjusted.

Hereinafter, organic light-emitting display devices including the touch sensing units 50a, 50a_1 to 50a_11, according to the above-described exemplary embodiments, will be described.

Figure 34:
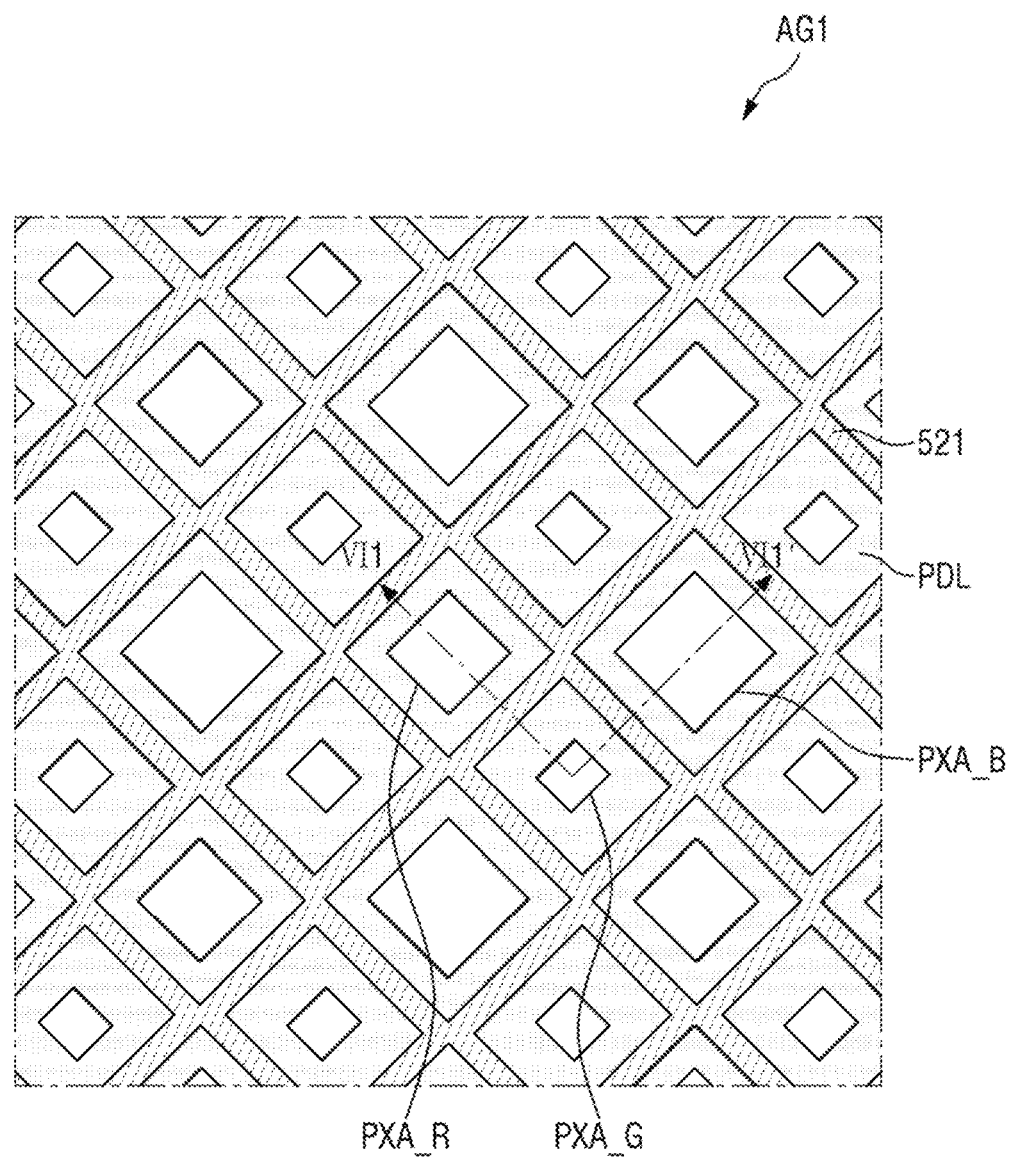
FIG. 34 is an enlarged view illustrating area AG1 of FIG. 1.

FIG. 34 is an enlarged view of area AG1 of FIG. 1. FIG. 35 is a cross-sectional view taken along line VI1-VI1' of FIG. 34.

Referring to FIG. 34, the base layer 51 includes emission regions PXA_R, PXA_G and PXA_B, and a non-emission region disposed such that it at least partially surrounds the emission regions PXA_R, PXA_G and PXA_B and separating the emission regions PXA_R, PXA_G and PXA_B from one another. The emission regions PXA_R, PXA_G and PXA_B may be separated from one another by a pixel-defining layer PDL. For example, in the display area DA1, the portion overlapping the pixel-defining layer PDL may be the non-emission region, while the portions not overlapping the pixel defining layer PDL may be the emission regions PXA_R, PXA_G and PXA_B. In an exemplary embodiment of the present disclosure, the non-emission region may be in the form of a mesh, but the shape is not limited thereto.

The mesh pattern of each of the sensing electrodes 521 may define a plurality of mesh holes. The mesh holes may be formed in the emission regions PXA_R, PXA_G and PXA_B, respectively. The mesh holes may be included in the non-emission region.

The emission regions PXA_R, PXA_G and PXA_B may be sorted into groups by the colors of light generated in the organic light-emitting diodes. In the example shown in FIG. 34, three groups of emission regions PXA_R, PXA_G and PXA_B sorted by the colors of the light are depicted.

The emission regions PXA_R, PXA_G and PXA_B may have different areas depending on the colors of the light emitted from an organic emissive layer 312 (see FIG. 35) of the organic light-emitting diode. The area of the emission regions PXA_R, PXA_G and PXA_B may be determined depending on the type of the organic light-emitting diode. For example, the emission regions PXA_R, PXA_G and PXA_B may include a first emission region PXA_R, a second emission region PXA_G, and a third emission region PXA_B. The area of the third emission region PXA_B may be larger than the area of the first emission region PXA_R, and the area of the first emission region PXA_R may be larger than the area of the second emission region PXA_G. In this exemplary embodiment, the first emission region PXA_R emits red light, the second emission region PXA_G emits green light, and the third emission region PXA_B emits blue light. It is, however, to be understood that the present disclosure is not limited thereto. According to alternative arrangements, the first to third emission regions PXA_R, PXA_G and PXA_B may emit light of cyan, magenta and yellow, instead of the red, green and blue.

The mesh holes may be sorted into groups having different areas. For example, mesh holes may be sorted into three groups by the emission regions PXA_R, PXA_G and PXA_B associated therewith.

In the foregoing description, the mesh holes are formed in the emission regions PXA_R, PXA_G and PXA_B, respectively, but the present disclosure is not limited thereto. Each of the mesh holes may be associated with two or more emission regions PXA_R, PXA_G, and PXA_B. In addition, although the emitting regions PXA_R, PXA_G and PXA_B have different areas, this is merely illustrative. The emission regions PXA_R, PXA_G and PXA_B all may have the same size, and all of the mesh holes may also have the same size.

The shape of the mesh holes, when viewed from the top, is not limited to what is shown herein but may alternatively have a diamond shape or other polygonal shapes. The shape of the mesh holes, when viewed from the top, may have a polygonal shape with rounded corners.

As the first sensing electrodes 510 and the second sensing electrodes 520 have a mesh shape, the first sensing electrodes 510 and the second sensing electrodes 520 do not overlap the emission regions PXA_R, PXA_G and PXA_B and thus are not visible to a user who watches the organic light-emitting display device. In addition, in the first sensing electrodes 510 and the second sensing electrode 520, the parasitic capacitance between the electrodes of the light-emitting element layer 30 can be reduced.

Referring to FIG. 35, a base substrate 101 may be a rigid or flexible substrate. If the base substrate 101 is a rigid substrate, it may be a glass substrate, a quartz substrate, a glass ceramic substrate, and/or a crystalline glass substrate. If the base substrate 101 is a flexible substrate, it may be a film substrate including a polymer organic material or a plastic substrate. In addition, the base substrate 101 may include fiberglass reinforced plastic (FRP).

On the base substrate 101, the display area DA1 and the non-display area NA described above may be defined.

The base substrate 101 shown in FIG. 35 may correspond to the first substrate 10 of FIG. 2.

A first buffer layer 201 is disposed on the base substrate 101. The first buffer layer 201 smooths the surface of the base substrate 101 and prevents the permeation of moisture or air therethrough. The first buffer layer 201 may be an inorganic layer. The first buffer layer 201 may be made up of a single layer or multiple layers.

On the first buffer layer 201, a plurality of thin-film transistors TR1, TR2 and TR3 are disposed. The plurality of thin-film transistors TR1, TR2 and TR3 may be driving thin-film transistors.

Each of the thin-film transistors TR1, TR2 and TR3 may include a first thin-film transistor TR1, a second thin-film transistor TR2 and a third thin-film transistor TR3. The thin-film transistors TR1, TR2, and TR3 may be disposed in emission regions PXA_R, PXA_G, and PXA_B, respectively. For example, the first thin-film transistor TR1 may be disposed in the first emission region PXA_R, the second thin-film transistor TR2 may be disposed in the second emission region PXA_G, and the third thin-film transistor TR3 may be disposed in the third emission region PXA_B.

The thin-film transistors TR1, TR2 and TR3 may include semiconductor layers A1, A2 and A3, gate electrodes G1, G2 and G3, source electrodes S1, S2 and S3, and drain electrodes D1, D2 and D3, respectively. More specifically, the semiconductor layers A1, A2, and A3 are disposed on the first buffer layer 201. The semiconductor layers A1, A2 and A3 may include an amorphous silicon, a poly silicon, a low-temperature poly silicon, and an organic semiconductor. In an exemplary embodiment of the present disclosure, the semiconductor layers A1, A2 and A3 may be oxide semiconductors. The semiconductor layer A1, A2 and A3 may include a channel region, and a source region and a drain region which are disposed on the sides of the channel region, respectively, and are doped with impurities.

A gate insulating layer 211 is disposed on the semiconductor layers A1, A2 and A3. The gate insulating layer 211 may be an inorganic layer. The gate insulating layer 211 may be made up of a single layer or multiple layers.

On the gate insulating layer 211, the gate electrodes G1, G2 and G3 are disposed. The gate electrodes G1, G2 and G3 may be made of a conductive metal material, for example, the gate electrodes G1, G2 and G3 may include molybdenum (Mo), aluminum (Al), copper (Cu), and/or titanium (Ti). The gate electrodes G1, G2 and G3 may be made of a single layer or multiple layers.

An interlayer dielectric layer 212 is disposed on the gate electrodes G1, G2 and G3. The interlayer dielectric layer 212 may be an inorganic layer. The interlayer dielectric layer 212 may be made up of a single layer or multiple layers.

The source electrodes S1, S2 and S3 and the drain electrodes D1, D2 and D3 are disposed on the interlayer dielectric layer 212. The source electrodes S1, S2 and S3 and the drain electrodes D1, D2 and D3 are made of a conductive metal material. For example, the source electrodes S1, S2 and S3 and the drain electrodes D1, D2 and D3 may include aluminum (Al), copper (Cu), titanium (Ti), and/or molybdenum (Mo).

The source electrodes S1, S2 and S3 and the drain electrodes D1, D2 and D3 may be electrically connected to the source regions and the drain regions of the semiconductor layers A1, A2 and A3, respectively, through contact holes that pass through the interlayer dielectric layer 212 and the gate insulating layer 211.

The organic light-emitting display device 1 may further include a storage capacitor and a switching thin-film transistor on the base substrate 101.

A protective layer 220 is disposed on the source electrodes S1, S2 and S3 and the drain electrodes D1, D2 and D3. The protective layer 220 covers the circuitry including the thin-film transistors TR1, TR2 and TR3. The protective layer 220 may be a passivation layer or a planarizing layer. The passivation layer may include SiO2, SiNx, etc., and the planarization layer may include materials such as acrylic and polyimide. The protective layer 220 may include both the passivation layer and the planarization layer. In such case, the passivation layer may be disposed over the source electrodes S1, S2 and S3, the drain electrodes D1, D2 and D3, and the interlayer dielectric layer 212, and the planarization layer may be disposed on the passivation layer. The upper surface of the protective layer 220 may be flat.

The first buffer layer 201 and the protective layer 220 shown in FIG. 35 may correspond to the circuit layer 20 of FIG. 2.

A plurality of first pixel electrodes 311 is disposed on the protective layer 220. The first pixel electrode 311 may be disposed in each of the emission regions PXA_R, PXA_G and PXA_B. In addition, each of the first electrodes 311 may be an anode electrode of the respective organic light-emitting diodes.

The first electrodes 311 may be electrically connected to the drain electrodes D1, D2 and D3 (or the source electrodes S1, S2 and S3) disposed on the base substrate 101 through the via holes passing through the protective layer 220, respectively.

The first pixel electrodes 311 may have different areas in accordance with the areas of the emission regions PXA_R, PXA_G, and PXA_B.

The first pixel electrodes 311 may be made of a material having a high work function. The first pixel electrodes 311 may include indium-tin-oxide (ITO), indium-zinc-oxide (IZO), zinc oxide (ZnO), indium oxide (In2O3), and/or a material having a work function within a range of cofunctions of the aforementioned materials.

A pixel-defining layer PDL is disposed over the first pixel electrodes 311. The pixel-defining layer PDL includes a plurality of openings. At least a part of each of the first pixel electrodes 311 is exposed via the respective openings. The openings may have different widths in accordance with the areas of the emission regions PXA_R, PXA_G and PXA_B.

The pixel-defining layer PDL may include an organic material or an inorganic material. In an exemplary embodiment of the present disclosure, the pixel-defining layer PDL may include a material such as a photoresist, a polyimide resin, an acrylic resin, a silicon compound and a polyacrylic resin.

An organic emissive layer 312 is disposed on the first electrode 311 exposed by the pixel-defining layer PDL.

A second pixel electrode 313 is disposed on the organic emissive layer 312. The second pixel electrode 313 may be a common electrode extended across all the pixels In addition, the second pixel electrode 313 may work as the cathode electrodes of organic light-emitting diode.

The second pixel electrode 313 may be made of a material having a low work function. The second pixel electrode 313 may include Li, Ca, LiF/Ca, LiF/Al, Al, Mg, Ag, Pt, Pd, Ni, Au, Nd, Ir, Cr, BaF, Ba, or a compound or mixture thereof, e.g., a mixture of Ag and Mg. A low work function material may be any material having a work function within the range of work functions of the above-named materials. The second pixel electrode 313 may be connected to a power line through an electrode formed in the same layer as the first pixel electrodes 311.

The first pixel electrodes 311, the organic emissive layer 312 and the second pixel electrode 313 may form the organic light-emitting diodes (OLEDs). In addition, the first pixel electrodes 311 and the second pixel electrode 313 shown in FIG. 35 may correspond to the light-emitting element layer 30 of FIG. 2.

The encapsulation layer 450 may be disposed on the second pixel electrode 313. The encapsulation layer 450 includes an inorganic layer and an organic layer. The encapsulation layer 450 may include a plurality of layers stacked on one another. As shown in FIG. 35, the encapsulation layer 450 may be made up of multiple layers including a first inorganic layer 451, an organic layer 452, and a second inorganic layer 453 which are stacked on one another in this order. The first inorganic layer 451 and the second inorganic layer 453 may include silicon oxide (SiOx), silicon nitride (SiNx) and/or silicon oxynitride (SiONx). The organic layer 452 may include epoxy, acrylate and/or urethane acrylate.

The encapsulation layer 450 shown in FIG. 35 may correspond to the encapsulation layer 40 of FIG. 2.

The touch sensing unit 50a may be disposed on the encapsulation layer 450 in order. The touch sensing unit 50a may correspond to the touch layer 50 of FIG. 2.

The cover window 601 may be disposed on the touch layer 50. The cover window 601 can protect the light-emitting element layer 30, the circuit layer 20 or the touch layer 50 from scratches by an external object. The cover window 601 may be attached to the touch layer 50 by an adhesive member 610 such as an optically clear adhesive (OCA) or an optically clear resin (OCR).

The cover window 601 shown in FIG. 35 may correspond to the second substrate 60 of FIG. 2 including the adhesive member 610.

An optical member such as an anti-reflection film and a polarizing film may be disposed on or under the cover window 601, or a color filter may be disposed under the cover window 601.

Figure 36:
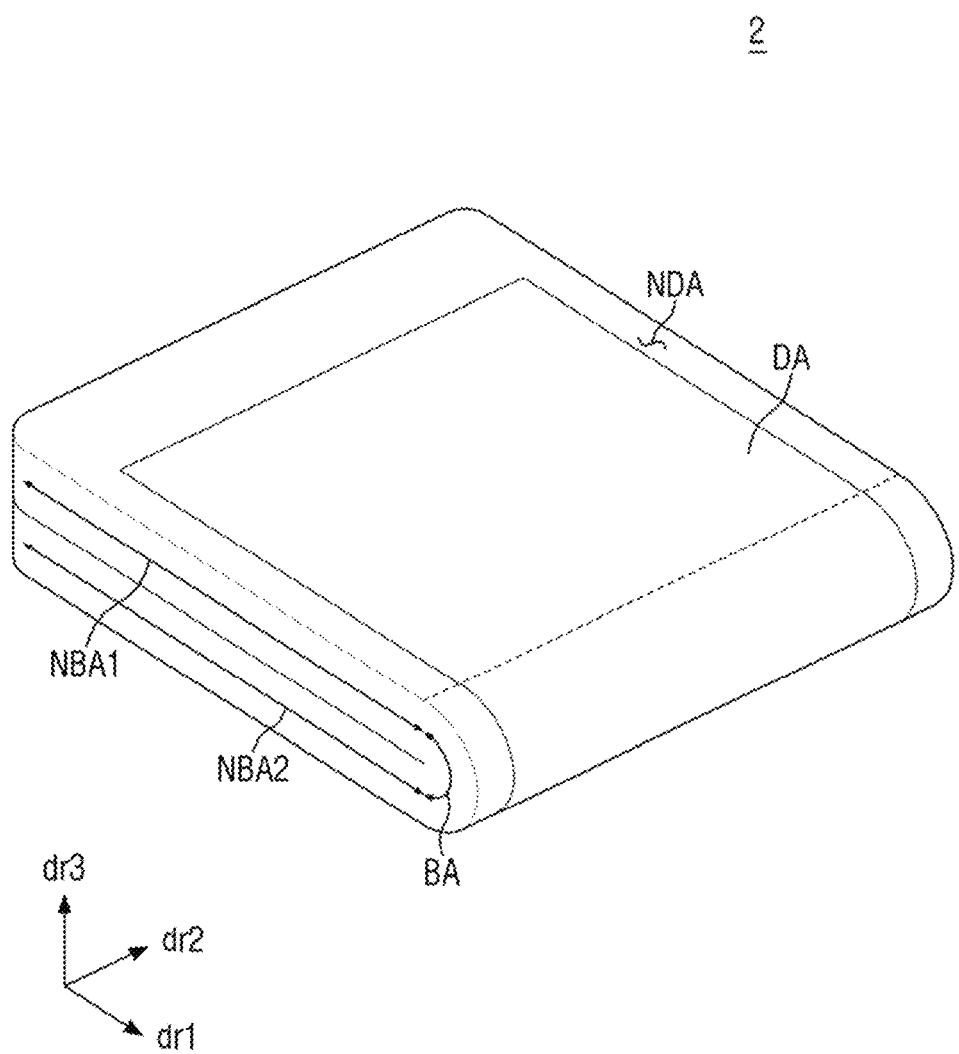
FIG. 36 is a perspective view illustrating an organic light-emitting display device according to an exemplary embodiment of the present disclosure.

FIG. 36 is a perspective view of an organic light-emitting display device according to an exemplary embodiment of the present disclosure. The organic light-emitting display device 2 of FIG. 36 is a modification in which the organic light-emitting display device 1 of FIG. 1 is bendable.

The organic light-emitting display device 2 may be foldable. For example, the base substrate 101 may be a flexible substrate having excellent flexibility so that it may be bent upon itself without cracking or breaking. The first and second touch insulating layers 53 and 55 may include one or more of the organic materials listed above.

The organic light-emitting display device 2, according to an exemplary embodiment of the present disclosure, may include a bending area BA that can be bent with respect to a bending axis, a first non-banding area NBA1, and a second non-banding area NBA2 which are not bent. The bending area BA may include a portion of a display area DA and a non-display area NDA, and similarly, portions of the display area DA and the non-display area NDA may be part of the non-bending areas NBA1 and NBA2.

The effects of the present invention are not limited by the foregoing, and other various effects are anticipated herein.

Although various exemplary embodiments of the present invention have been disclosed for illustrative purposes, those skilled in the art will appreciate that various modifications, additions and substitutions are possible, without departing from the scope and spirit of the invention.

What is claimed is:

1. A touch sensing unit, comprising:
   a plurality of first sensing electrodes; and
   a plurality of second sensing electrodes intersecting with and insulated from the plurality of first sensing electrodes,
   wherein the plurality of first sensing electrodes comprises a plurality of first sensor portions and a plurality of first connection portions connecting each of the plurality of first sensor portions with one another,
   wherein the plurality of second sensing electrodes comprises a plurality of second sensor portions, a plurality of stem sensors extended from the plurality of second sensor portions, and a plurality of second connection portions connecting each of the plurality of sensor portions with one another,
   wherein each of the plurality of first sensor portions comprises a plurality of depressions indented inwardly, and
   wherein each of the plurality of stem sensors is inserted into the plurality of depressions to be disposed such that it is at least partially surrounded by a respective depression of the plurality of depressions.

2. The touch sensing unit of claim 1, further comprising:
   a plurality of first electrode patterns, each of which disposed between a respective depression of the plurality of depressions and a respective stem sensor of the plurality of stem sensors,
   wherein the first electrode patterns are insulated from the first sensing electrodes and the second sensing electrodes.

3. The touch sensing unit of claim 2, wherein each of the plurality of first electrode patterns is a floating electrode.

4. The touch sensing unit of claim 2, wherein the first electrode patterns of the plurality of first electrode patterns are electrically connected to one another.

5. The touch sensing unit of claim 4, wherein a first reference voltage signal is applied to the plurality of first sensing electrodes, a second reference voltage signal is applied to the plurality of second sensing electrodes, and a third reference voltage signal is applied to the plurality of first electrode patterns, and wherein the third reference voltage signal has a voltage level that is lower than that of the first reference voltage signal and that of the second reference voltage signal.

6. The touch sensing unit of claim 4 further comprising: a plurality of second electrode patterns disposed between the plurality of first sensor portions and the plurality of second sensor portions and wherein the plurality of second electrode patterns is insulated from the plurality of first sensor portions and the plurality of second sensor portions.

7. The touch sensing unit of claim 4, further comprising: a plurality of third electrode patterns disposed in the plurality of first sensor portions and insulated from the plurality of first sensor portions.

8. The touch sensing unit of claim 4, wherein each of the plurality of first electrode patterns are spaced apart from one another in row and column directions.

9. The touch sensing unit of claim 4, further comprising: a plurality of third connection portions connecting each of the plurality of first electrode patterns with one another.

10. The touch sensing unit of claim 9, wherein the plurality of third connection portions is disposed in a same layer as the plurality of second connection portions, and the plurality of third connection portions is disposed on a different layer than the plurality of first connection portions.

11. The touch sensing unit of claim 1, wherein a border of each of the plurality of stem sensors has a saw-tooth shape.

12. The touch sensing unit of claim 11, wherein each of the plurality of stem sensors has a first width in a first region and a second width in a second region that is larger than the first width.

13. The touch sensing unit of claim 12, wherein the first width is equal to or greater than 50 μm and less than 150 μm, and the second width is equal to or greater than 150 μm and less than 200 μm.

14. The touch sensing unit of claim 1, wherein the plurality of second connection portions and the plurality of first connection portions intersect each other, and are disposed in different layers with an insulating layer interposed therebetween.

15. The touch sensing unit of claim 14, wherein the insulating layer comprises an organic material.

16. The touch sensing unit of claim 1, wherein the plurality of first sensing electrodes and the plurality of second sensing electrodes each have a mesh shape.

17. A touch sensing unit, comprising:
    a plurality of first sensing electrodes; and a plurality of second sensing electrodes intersecting with and insulated from the plurality of first sensing electrodes, wherein the plurality of first sensing electrodes comprises a plurality of first sensor portions and a plurality of first connection portions connecting each of the plurality of first sensor portions with one another, wherein the plurality of second sensing electrodes comprises a plurality of second sensor portions, a plurality of stem sensors extended from the plurality of second sensor portions, and a plurality of second connection portions connecting each of the plurality of sensor portions with one another, wherein each of the plurality of first sensor portions comprises a plurality of depressions indented inwardly, wherein each of the plurality of stem sensors is disposed such that it is at least partially surrounded by a respective depression of the plurality of depressions, and wherein each of the plurality of first sensing electrodes is extended in a first direction, each of the plurality of second sensing electrodes is extended in a second direction that intersects the first direction, and each of the plurality of stem sensors is extended from the plurality of sensor portions in a direction different from the first and second directions.

18. A display device, comprising:
a base layer comprising a display area and a non-display area at least partially surrounding the display;
a plurality of first signal lines disposed on a first side border of the non-display area;
a plurality of second signal lines disposed on a second side border of the non-display area;
a ground line disposed on a third border of the non-display area;
a plurality of first sensing electrodes disposed in the display area and connected to the plurality of first signal lines, a plurality of second sensing electrodes disposed in the display area, connected to the plurality of second signal lines, and intersecting with and insulated from the plurality of first sensing electrodes; and
a plurality of ground electrodes disposed in the display area, connected to the ground line, and disposed between the plurality of first sensing electrodes and the plurality of second sensing electrodes, wherein each of the ground electrodes of the plurality of ground electrodes are insulated from the plurality of first sensing electrodes and the plurality of second sensing electrodes.

19. The display device of claim 18, wherein the ground line is disposed between the plurality of first sensing electrodes and the plurality of second signal lines.

20. The display device of claim 19, wherein a first reference voltage signal is applied to the plurality of first signal lines, a second reference voltage signal is applied to the plurality of second signal lines, and a third reference voltage signal is applied to the ground line, and wherein the third reference voltage signal has a voltage level that is lower than that of the first reference voltage signal and that of the second reference voltage signal.

21. The display device of claim 18, wherein each of the plurality of first sensing electrodes comprises a plurality of depressions indented inwardly, and
wherein each of the plurality of second sensing electrodes comprises a plurality of stem sensors extended from the plurality of second sensing electrodes and at least partially surrounded by the plurality of depressions.

22. The display device of claim 21, wherein each of the plurality of ground electrodes is disposed between a respective depression of the plurality of depressions and a respective stem sensor of the plurality of stem sensors.

23. The display device of claim 18, wherein each of the plurality of first sensing electrodes is a sensing electrode and each of the plurality of second sensing electrodes is a driving electrode.

24. The display device of claim 18, wherein the plurality of first signal lines further comprises first ends of the plurality of first sensing electrodes, and wherein the display device further comprises a plurality of third signal lines connected to second ends of the plurality of first sensing electrodes.

25. The display device of claim 18, wherein each of the plurality of second sensing electrodes comprises an extension connected to the plurality of second signal lines, wherein the ground line traverses the extension, and both the ground line and the extension are insulated from each other.

* * * * *